(12) United States Patent
Numagi et al.

(10) Patent No.: US 9,907,155 B2
(45) Date of Patent: Feb. 27, 2018

(54) PRINTED WIRING BOARD AND PRINTED CIRCUIT BOARD

(71) Applicant: CANON KABUSHIKI KAISHA, Tokyo (JP)

(72) Inventors: Takashi Numagi, Kawasaki (JP); Hikaru Nomura, Tokyo (JP); Masanori Kikuchi, Yokohama (JP); Hiroyuki Mizuno, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 235 days.

(21) Appl. No.: 14/438,546

(22) PCT Filed: Nov. 14, 2013

(86) PCT No.: PCT/JP2013/081333
§ 371 (c)(1),
(2) Date: Apr. 24, 2015

(87) PCT Pub. No.: WO2014/080963
PCT Pub. Date: May 30, 2014

(65) Prior Publication Data
US 2015/0319845 A1    Nov. 5, 2015

(30) Foreign Application Priority Data
Nov. 20, 2012   (JP) .................. 2012-254079

(51) Int. Cl.
*H05K 7/10* (2006.01)
*H05K 7/12* (2006.01)
(Continued)

(52) U.S. Cl.
CPC ......... *H05K 1/0216* (2013.01); *H05K 1/0251* (2013.01); *H05K 1/0298* (2013.01);
(Continued)

(58) Field of Classification Search
CPC .. H05K 1/0216; H05K 1/0243; H05K 1/0251; H05K 1/0298; H05K 1/111;
(Continued)

(56) References Cited

U.S. PATENT DOCUMENTS 5,220,201 A   6/1993  Kawasaki et al.
6,388,886 B1  5/2002  Tobita
(Continued)

FOREIGN PATENT DOCUMENTS

DE   10 2005 060 081 A1   6/2007
JP   2002-026248          1/2002
JP   2010-0282702         12/2010

OTHER PUBLICATIONS

Japanese Office Action dated Nov. 1, 2016 during prosecution of related Japanese application No. 2012-254079.
(Continued)

*Primary Examiner* — Yuriy Semenenko
(74) *Attorney, Agent, or Firm* — Fitzpatrick, Cella, Harper & Scinto

(57) ABSTRACT

A printed wiring board includes a first main wire having first inner layer wiring patterns which are wired on inner layers connected by first via conductors in series. In addition, a second main wire has second inner layer wiring patterns which are wired on the inner layers connected by second via conductors. The first inner layer wiring patterns and the second inner layer wiring patterns are wired so as to change the layer to the inner layer on the opposite side to each other. First and second branch wires are branched from the first and second via conductors, respectively.

19 Claims, 11 Drawing Sheets

(51) Int. Cl.
  H05K 1/02 (2006.01)
  H05K 1/11 (2006.01)
  H05K 1/18 (2006.01)
  H05K 3/42 (2006.01)

(52) U.S. Cl.
  CPC .............. *H05K 1/111* (2013.01); *H05K 1/115* (2013.01); *H05K 1/181* (2013.01); *H05K 1/0243* (2013.01); *H05K 1/114* (2013.01); *H05K 3/429* (2013.01); *H05K 2201/097* (2013.01); *H05K 2201/09254* (2013.01); *H05K 2201/09263* (2013.01); *H05K 2201/09627* (2013.01); *H05K 2201/10159* (2013.01)

(58) Field of Classification Search
  CPC ........ H05K 1/114; H05K 1/115; H05K 1/181; H05K 2201/09254; H05K 2201/09263; H05K 2201/09627; H05K 2201/097; H05K 2201/10159
  See application file for complete search history.

(56) References Cited

U.S. PATENT DOCUMENTS

| | | | |
|---|---|---|---|
| 7,013,452 B2* | 3/2006 | Baras | H05K 1/0216 333/128 |
| 7,176,383 B2* | 2/2007 | Lauffer | H05K 1/0216 174/255 |
| 7,692,300 B2 | 4/2010 | Kikuchi | |
| 2004/0176938 A1* | 9/2004 | Gisin | G06F 17/5036 703/14 |
| 2007/0158827 A1 | 7/2007 | Schuster | |
| 2008/0025007 A1* | 1/2008 | Ao | H05K 1/115 361/760 |
| 2008/0227311 A1 | 9/2008 | Chan et al. | |
| 2009/0159326 A1* | 6/2009 | Mellitz | H05K 1/0251 174/266 |
| 2010/0312925 A1 | 12/2010 | Osanai | |
| 2011/0317372 A1 | 12/2011 | Nomoto et al. | |
| 2012/0262885 A1 | 10/2012 | Ikeda et al. | |
| 2014/0226278 A1 | 8/2014 | Kikuchi | |

OTHER PUBLICATIONS

International Preliminary Report on Patentability dated May 26, 2015 in PCT/JP2013/081333.

Kanedo, et al., "Resonance Stub Effect in a Transition From a Through Via Hole to a Stripline in Multilayer PCB's", IEEE Microwave and Wireless Components Letters, IEEE Service Center, New York, NY, US, vol. 13, No. 5, May 1, 2003 pp. 169-171 (XP011096127).

International Search Report and Written Opinion of the International Searching Authority dated Dec. 5, 2014 in PCT/JP2013/081333.

JEDEC standard No. 21C, "PC3-6400 / PC3-8500 / PC3-10600 / PC3-12800 DDR3 Unbuffered SO-DIMM Reference Design Specification", Feb. 2009.

"DDR3 SDRAM Standard JESD79-3D", Sep. 2009, JEDEC Solid State Technology Association.

* cited by examiner

PRINTED WIRING BOARD AND PRINTED CIRCUIT BOARD

TECHNICAL FIELD

The present invention relates to a printed wiring board and a printed circuit board, on which a plurality of receiving elements are electrically connected to a main wire by branch wires.

BACKGROUND ART

Generally, a memory system using a DDR (Double Data Rate) 3 memory or the like includes a memory controller which works as a transmitting element, a plurality of memory devices which work as receiving elements, and a printed wiring board including signal-connecting wires for mounting the memory controller and the memory devices thereon.

The memory controller transmits an address command signal, a plurality of the memory devices are controlled by receiving the address command signal, and the memory controller and a plurality of the memory devices transmit and receive a data signal to and from each other. In particular, a plurality of DDR3 memories are mounted on and used for electronic equipment having high functions in many cases, in order to secure its memory capacity.

The DDR3 memory has a function of adjusting the timing of transmitting a signal integrated therein. A plurality of the memory devices are connected by a wiring structure in which a plurality of branch wires are sequentially branched from one main wire, which is referred to as fly-by that can increase a speed of an address command signal (see NPL 1).

FIG. 13 is a wiring diagram illustrating a wiring configuration according to a conventional fly-by method. A memory controller 200 is connected to wires to which a termination potential is applied through a termination resistor, through a plurality of main wires. In FIG. 13, two main wires 11 and 12 are illustrated among the plurality of the main wires. Respective memory devices $300_1$ to $300_4$ are connected to the main wire 11 through branch wires 31 to 34 which are branched at branch points P1 to P4, respectively. In addition, the respective memory devices $300_1$ to $300_4$ are connected to the main wire 12 through branch wires 41 to 44 which are branched at branch points P5 to P8, respectively. Terminations of the main wires 11 and 12 are connected to a termination wire 403 to which termination voltage is applied, through termination resistors 401 and 402.

FIGS. 14A and 14B are sectional views illustrating the wiring structure in the conventional printed wiring board. As is illustrated in FIG. 14A and FIG. 14B, two layers of inner layers of a printed wiring board are used for the main wires 11 and 12 which are address command wires of the DDR3 memories.

Specifically, as is illustrated in FIG. 14A, the main wire 11 uses an inner layer 13, and as is illustrated in FIG. 14A, the main wire 12 uses an inner layer 14. A BGA (Ball Grid Array) type of semiconductor package is used for the memory devices $300_1$ to $300_4$. Each of the branch wires 31 to 34 formed on the printed wiring board includes a via which is electrically connected to the main wire 11, a mounting pad which is connected to the receiving terminal of the semiconductor package, and a leading wire which connects the via with the mounting pad. Similarly, each of the branch wires 41 to 44 includes a via which is electrically connected to the main wire 12, a mounting pad which is connected to the receiving terminal of the semiconductor package, and a leading wire which connects the via with the mounting pad.

In the case of the wiring structure in which a plurality of branch wires are sequentially branched from one main wire, which is referred to as the fly-by, as the length of the branch wire increases, the decay and reflection of the signal increase, which causes the turbulence of the waveform of the signal that reaches memory devices $300_1$ to $300_4$. Accordingly, ringing increases in the branch wires 41 to 44, and especially in the branch wire 41 which is branched from the branch point P5 that is nearest to the starting end of the main wire 12, because the wiring length is longer than those of the branch wires 31 to 34, and there is the case where conditions on input voltage for a signal cannot be satisfied. Accordingly, it is important to shorten the branch wire, in order to satisfy the conditions on the input voltage for a signal.

In recent years, the number of the signal wires for transmitting the signal to the memory device therethrough has extremely increased. Because of this, when the branch wires are formed according to the fly-by mode, the position of the via cannot but become far from the signal terminal of the memory device, and cannot but become nonuniform, in order to secure the region which forms the via.

CITATION LIST

Non Patent Literature

NPL 1: JEDEC standard No. 21C PC3-6400/PC3-8500/PC3-10600/PC3-12800 DDR3 Unbuffered SO-DIMM Reference Design Specification NPL 2: DDR3 SDRAM Standard JESD79-3D

SUMMARY OF INVENTION

Solution to Problem

An object of the present invention is to provide an inexpensive printed wiring board and an inexpensive printed circuit board which have short wiring lengths of the branch wires and can reduce ringing even without upsizing the printed wiring board.

According to one aspect of the present invention, A printed wiring board comprising: a first outer layer; a second outer layer on the opposite side of the first outer layer; a first inner layer arranged between the first outer layer and the second outer layer; a second inner layer that is arranged between the first outer layer and the second outer layer and is positioned closer to the second outer layer than the first inner layer, wherein the first outer layer, the second outer layer, the first inner layer and the second inner layer are laminated with insulating layers disposed therebetween; a first main wire, wherein the first main wire has a plurality of first inner layer wiring patterns which are provided so as to have an electrode pad formed on the first outer layer for mounting a transmitting element thereon as a starting end, and alternate between the first inner layer and the second inner layer, toward a termination, and has a plurality of first via conductors between the inner layers, which connect the first inner layer wiring patterns provided on different layers to each other; a plurality of first branch wires that are sequentially branched from the starting end toward the termination of the first main wire, wherein the respective first branch wires comprise leading wires that are formed on the first outer layer, and first via conductors between the outer layer and the inner layer, and connect electrode pads formed on the first outer layer for mounting receiving elements thereon, with the first inner layer wiring patterns formed on the first inner layer; a second main wire, wherein the second main wire has a plurality of second inner layer wiring patterns which are provided so as to have an electrode pad formed on the first outer layer for mounting a transmitting element thereon as a starting end, and alternate between the first inner layer and the second inner layer, toward a termination, and has a plurality of second via conductors between the inner layers, which connect the second inner layer wiring patterns provided on the different layers to each other; and a plurality of second branch wires which are sequentially branched from the starting end toward the termination of the second main wire, wherein the respective second branch wires comprise leading wires that are formed on the first outer layer, and second via conductors between the outer layer and the inner layer, and connect electrode pads formed on the first outer layer for mounting receiving element thereon, with the second inner layer wiring patterns formed on the first inner layer.

Further features of the present invention will become apparent from the following description of exemplary embodiments with reference to the attached drawings.

DESCRIPTION OF EMBODIMENTS

Embodiments for carrying out the present invention will be now described below in detail with reference to the drawings.

First Embodiment

Figure 1:
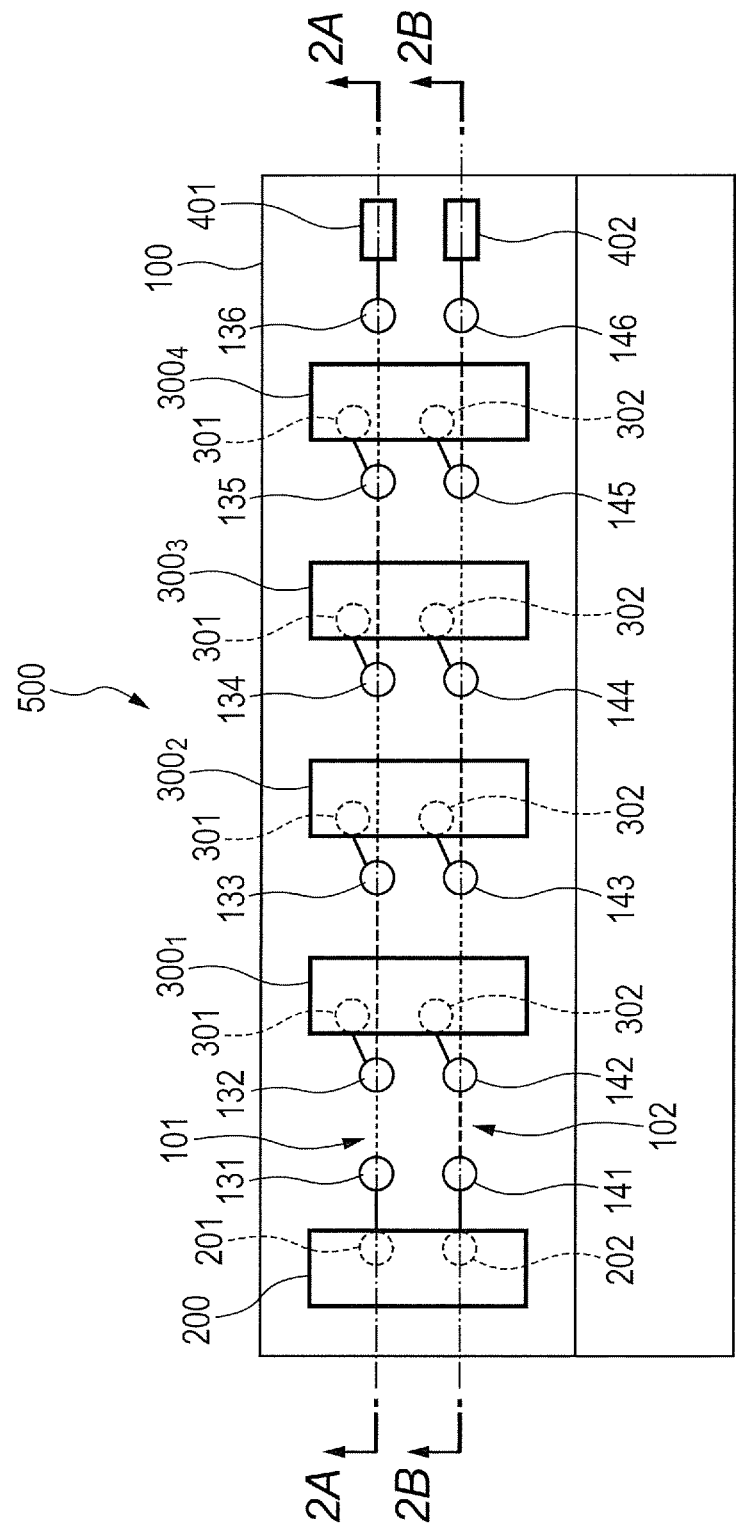
FIG. 1 is a plan view illustrating a schematic configuration of a printed circuit board according to a first embodiment.
Figure 2A:
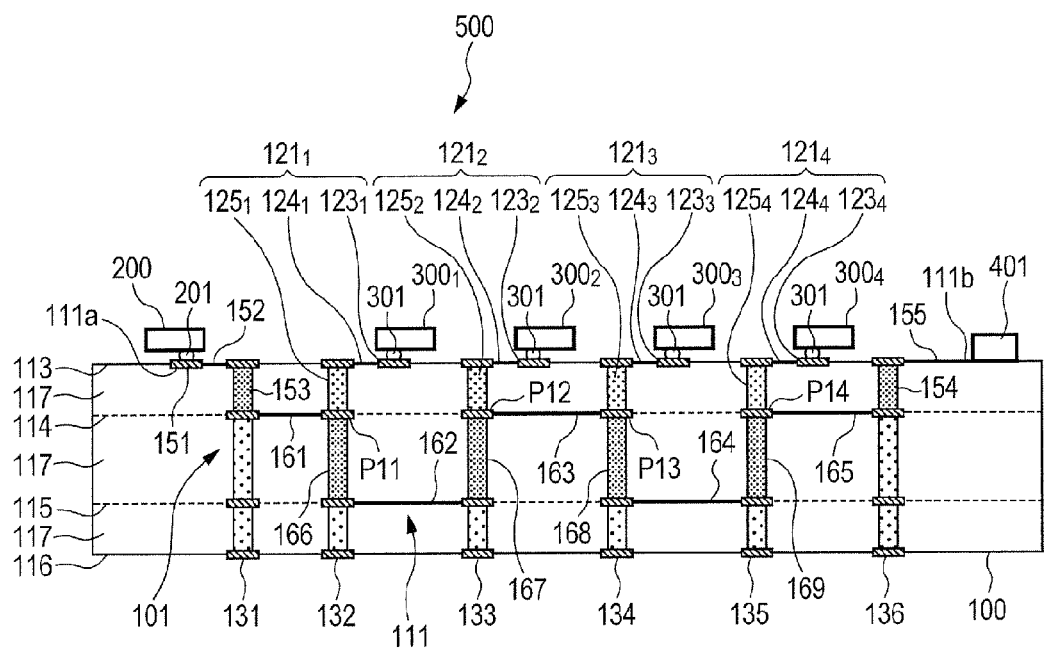
FIGS. 2A and 2B are sectional views of the printed circuit board according to the first embodiment.
Figure 2B:
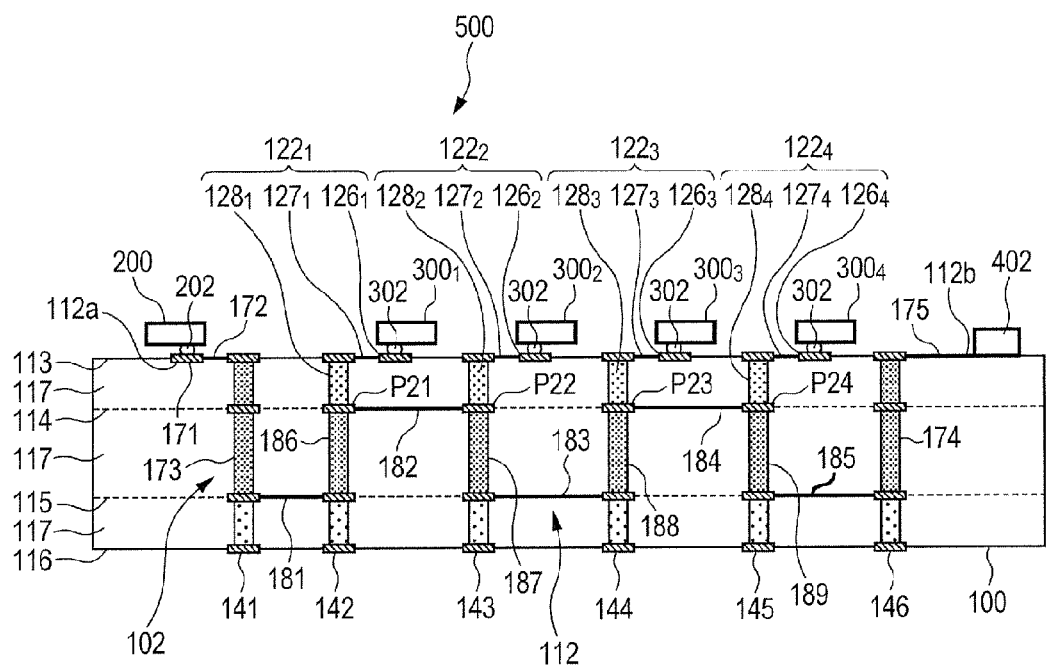

FIG. 1 is a plan view illustrating a schematic configuration of a printed circuit board according to a first embodiment of the present invention. FIGS. 2A and 2B are sectional views of the printed circuit board according to the first embodiment of the present invention. FIG. 2A is a sectional view taken along the line 2A-2A of the printed circuit board of FIG. 1, and FIG. 2B is a sectional view taken along the line 2B-2B of the printed circuit board of FIG. 1.

As is illustrated in FIG. 1, a printed circuit board 500 has a printed wiring board 100, and a memory controller 200 as a transmitting element mounted on the printed wiring board 100. In addition, the printed circuit board 500 has a plurality (four in the present first embodiment) of memory devices $300_1$, $300_2$, $300_3$ and $300_4$ as receiving elements.

The memory controller 200 is a BGA (Ball Grid Array) type of semiconductor package. The memory controller 200 has a plurality of transmission terminals which transmit an address command signal, in addition to a terminal (not illustrated) which transmits and receives a data signal. The plurality of these transmission terminals is divided into two groups, and is formed of a transmission terminal 201 (first transmission terminal) which belongs to a first group, and a transmission terminal 202 (second transmission terminal) which belongs to a second group. FIG. 1 illustrates each one transmission terminal 201 and 202.

The memory devices $300_1$ to $300_4$ are BGA (Ball Grid Array) type of semiconductor packages. The memory devices $300_1$ to $300_4$ are DDR3 memories. Each of the memory devices $300_1$ to $300_4$ has a plurality of receiving terminals which receive address command signals, in addition to a terminal (not illustrated) which transmits and receives the data signal. The plurality of the receiving terminals is formed of a receiving terminal 301 (first receiving terminal) which belongs to the first group and a receiving terminal 302 (second receiving terminal) which belongs to the second group, and FIG. 1 illustrates each one receiving terminal.

The printed wiring board 100 has a plurality of address command wires which connect the transmission terminals 201 and 202 of the memory controller 200 with the receiving terminals 301 and 302 of the respective memory devices $300_1$ to $300_4$ by a topology that is referred to as fly-by. The plurality of the address command wires is formed of an address command wire 101 (first address command wire) which belongs to the first group and an address command wire 102 (second address command wire) which belongs to the second group. FIG. 1 illustrates each one address command wire 101 and 102. In addition, the address command wires 101 and 102 in FIG. 1 are provided at such a position as not to overlap each other, when the printed wiring board 100 is viewed as a plane. However, the address command wires 101 and 102 may be arranged so as to overlap each other, in order that the printed wiring board is more efficiently used. When the wires are arranged so as to overlap each other, the wiring region of the printed wiring board 100 can be effectively used. However, vias which form each branch wire can be arranged at such a position as to be deviated from each other.

An address command wire 101 includes a main wire (first main wire) 111, and a plurality (four in the present first embodiment) of branch wires (first branch wires) $121_1$, $121_2$, $121_3$ and $121_4$, as is illustrated in FIG. 2A. An address command wire 102 includes a main wire (second main wire) 112, and a plurality (four in the present first embodiment) of branch wires (second branch wires) $122_1$, $122_2$, $122_3$ and $122_4$, as is illustrated in FIG. 2B.

Figure 13:
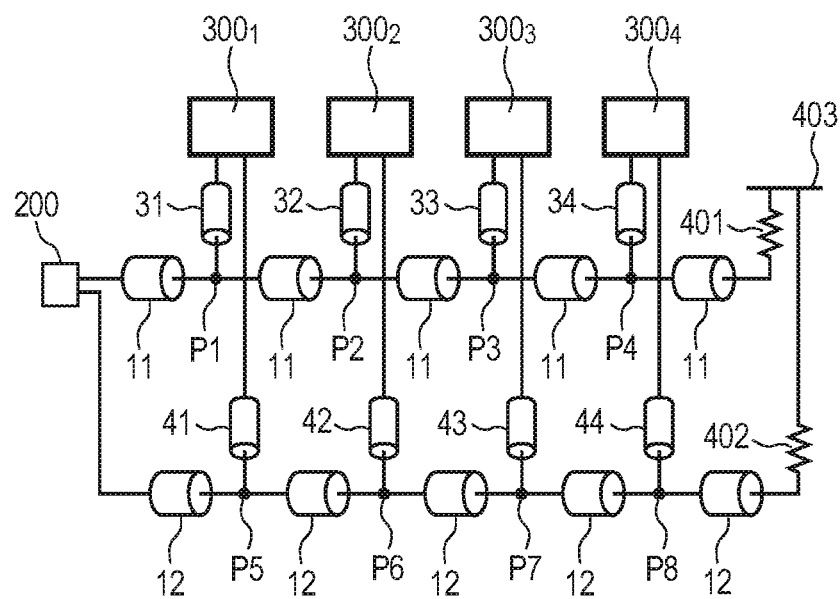
FIG. 13 is a wiring diagram illustrating a wiring configuration according to a conventional fly-by method.

The main wire 111 has a starting end 111a which is electrically connected to a transmission terminal (first transmission terminal) 201 of a memory controller 200, and has a termination 111b which is electrically connected to one end of a termination resistor 401. Similarly, the main wire 112 has a starting end 112a which is electrically connected to a transmission terminal (second transmission terminal) 202 of the memory controller 200, and has a termination 112b which is electrically connected to one end of a termination resistor 402. The other ends of the respective termination resistors 401 and 402 are electrically connected to a termination wire 403 (see FIG. 13) to which a termination potential is applied.

The respective branch wires $121_1$ to $121_4$ are branched from branch points P11, P12, P13 and P14 which are different from each other in the main wire 111, and are electrically connected to receiving terminals (first receiving terminals) 301 of the corresponding memory devices out of four memory devices $300_1$ to $300_4$, respectively. The respective branch wires $122_1$ to $122_4$ are branched from branch points P21, P22, P23 and P24 which are different from each other in the main wire 112, and are electrically connected to receiving terminals (second receiving terminals) 302 of the corresponding memory devices out of four memory devices $300_1$ to $300_4$, respectively. Specifically, one ends of the respective branch wires $121_1$ to $121_4$ are electrically connected to the respective branch points P11 to P14, and the other ends are electrically connected to the receiving terminals 301 of the respective memory devices $300_1$ to $300_4$. In addition, one ends of the respective branch wires $122_1$ to $122_4$ are electrically connected to the respective branch points P21 to P24, and the other ends are electrically connected to the receiving terminals 302 of the respective memory devices $300_1$ to $300_4$.

In the present first embodiment, the printed wiring board 100 is a multilayer printed wiring board which has at least four layers, specifically, an outer layer 113 that is a first outer layer, an inner layer 114 that is a first inner layer, an inner layer 115 that is a second inner layer, and an outer layer 116 that is a second outer layer sequentially laminated through insulating layers 117. Incidentally, the printed wiring board 100 has further an inner layer laminated therein which has a ground pattern arranged thereon, and an inner layer which has a power source pattern arranged thereon, though the illustration of the inner layers is omitted. The memory controller 200, the respective memory devices $300_1$ to $300_4$, and the respective termination resistors 401 and 402 are mounted on the outer layer 113. The inner layer 114 is an inner layer that is close to the outer layer 113 on which the memory devices $300_1$ to $300_4$ are mounted. On the other hand, the inner layer 115 is an inner layer which is far from the outer layer 113 on which the memory devices $300_1$ to $300_4$ are mounted.

As is illustrated in FIG. 2A, the printed wiring board 100 has a plurality (six) of vias 131 to 136 for the address command wire 101 formed therein, which penetrate layers from the outer layer 113 to the outer layer 116 that is on the opposite side to the outer layer 113, and have conductors provided in the inner perimeter surfaces thereof. In addition, as is illustrated in FIG. 2B, the printed wiring board 100 has a plurality (six) of vias 141 to 146 for the address command wire 102 formed therein, which penetrate layers from the outer layer 113 to the outer layer 116 that is on the opposite side to the outer layer 113, and have conductors provided in the inner perimeter surfaces thereof.

The main wire 111 that is the first main wire has an electrode pad 151 which is formed on the outer layer 113 and is joined to the transmission terminal 201 of the memory controller 200, and an outer layer wiring pattern 152 which extends from the electrode pad 151. In addition, the main wire 111 has an outer layer wiring pattern 155 which extends from one end of the termination resistor 401. In addition, the main wire 111 has inner layer wiring patterns 161 to 165 that are a plurality (five in the present embodiment) of first inner layer wiring patterns which are wired on the inner layer 114 and the inner layer 115 so as to change layers between the inner layer 114 and the inner layer 115, from the starting end 111a toward the termination 111b. In addition, the main wire 111 has via conductors 166 to 169 between the inner layers, which connect the five inner layer wiring patterns 161 to 165 in series, and are four first via conductors between the inner layers, which are the same number as that of the branch wires $121_1$ to $121_4$. In addition, the main wire 111 has a via conductor 153 between an outer layer and an inner layer, which connects the outer layer wiring pattern 152 with the inner layer wiring pattern 161, and a via conductor 154 between the outer layer and the inner layer, which connects the inner layer wiring pattern 165 with the outer layer wiring pattern 155.

These via conductors 166 to 169 between the inner layers are conductors in portions between the inner layer 114 and the inner layer 115, in the vias 132 to 135. The via conductor 153 between the outer layer and the inner layer is a conductor in a portion between the outer layer 113 and the inner layer 114, in the via 131, and the via conductor 154 between the outer layer and the inner layer is a conductor in a portion between the outer layer 113 and the inner layer 114, in the via 136.

In addition, the main wire 112 that is the second main wire has an electrode pad 171 which is formed on the outer layer 113 and is joined to the transmission terminal 202 of the memory controller 200, and an outer layer wiring pattern 172 which extends from the electrode pad 171. In addition, the main wire 112 has an outer layer wiring pattern 175 which extends from one end of the termination resistor 402. In addition, the main wire 112 has inner layer wiring patterns 181 to 185 that are a plurality (five in the present embodiment) of second inner layer wiring patterns which are wired on the inner layer 114 and the inner layer 115 so as to change layers between the inner layer 114 and the inner layer 115, from the starting end 112a toward the termination 112b. In addition, the main wire 112 has via conductors 186 to 189 between the inner layers, which connect the five inner layer wiring patterns 181 to 185 in series, and are four second via conductors between the inner layers, which are the same number as that of the branch wires $122_1$ to $122_4$. In addition, the main wire 112 has a via conductor 173 between the outer layer and the inner layer, which connects the outer layer wiring pattern 172 with the inner layer wiring pattern 181, and has a via conductor 174 between the outer layer and the inner layer, which connects the inner layer wiring pattern 185 with the outer layer wiring pattern 175.

These via conductors 186 to 189 between the inner layers are conductors in portions between the inner layer 114 and the inner layer 115, in the vias 142 to 145. The via conductor 173 between the outer layer and the inner layer is a conductor in a portion between the outer layer 113 and the inner layer 115, in the via 141, and the via conductor 174 between the outer layer and the inner layer is a conductor in a portion between the outer layer 113 and the inner layer 115, in the via 146.

The main wire 111 is wired so as to alternately change the layers, in such a way that the inner layer wiring pattern 161 is formed on the inner layer 114, the inner layer wiring pattern 162 is formed on the inner layer 115, the inner layer wiring pattern 163 is formed on the inner layer 114, the inner layer wiring pattern 164 is formed on the inner layer 115, and the inner layer wiring pattern 165 is formed on the inner layer 114. In addition, the main wire 112 is wired so as to alternately change the layers, in such a way that the inner layer wiring pattern 181 is formed on the inner layer 115, the inner layer wiring pattern 182 is formed on the inner layer 114, the inner layer wiring pattern 183 is formed on the inner layer 115, the inner layer wiring pattern 184 is formed on the inner layer 114, and the inner layer wiring pattern 185 is formed on the inner layer 115. Thus, the inner layer wiring patterns 181 to 185 of the main wire 112 are wired so as to alternately change the layer to the inner layer on the opposite side to that of the inner layer wiring patterns 161 to 165 of the main wire 111, from the starting end 112a toward the termination 112b. The inner layer wiring patterns 161 to 165 and the inner layer wiring patterns 181 to 185 can be provided at such a position that at least one part of the wiring patterns overlaps each other, when viewed as a plane from a direction of the outer layer 113 of the printed wiring board 100. When the wiring patterns are arranged so as to overlap each other, a wire region of the printed wiring board 100 can be effectively used.

At least the branch wire $121_1$ out of the plurality of the branch wires $121_1$ to $121_4$, which is branched from the branch point P11 that is closest to the starting end 111a of the main wire 111, is electrically connected to the via conductor between the inner layers of the main wire 111. In the present first embodiment, all the branch wires $121_1$ to $121_4$ are electrically connected to the via conductors 166 to 169 between the inner layers of the main wire 111, respectively. Specifically, one ends of the respective branch wires $121_1$ to $121_4$ are electrically connected to one ends of the respective via conductors 166 to 169 between the inner layers of the main wire 111. One ends of the via conductors 166 to 169 between the inner layers are ends in a side of the inner layer 114 that is close to the outer layer 113 on which the memory devices $300_1$ to $300_4$ are mounted.

Similarly, at least the branch wire $122_1$ out of the plurality of the branch wires $122_1$ to $122_4$, which is branched from the branch point P21 that is closest to the starting end 112a of the main wire 112, is electrically connected to the via conductor between the inner layers of the main wire 112. In the present first embodiment, all the branch wires $122_1$ to $122_4$ are electrically connected to the via conductors 186 to 189 between the inner layers of the main wire 112, respectively. Specifically, one ends of the respective branch wires $122_1$ to $122_4$ are electrically connected to one ends of the respective via conductors 186 to 189 between the inner layers of the main wire 112. One ends of the via conductors 186 to 189 between the inner layers are ends in a side of the inner layer 114 that is close to the outer layer 113 on which the memory devices $300_1$ to $300_4$ are mounted.

The respective branch wires $121_1$ to $121_4$ have electrode pads $123_1$ to $123_4$ of first electrode pads, which are formed on the outer layer 113 on which the corresponding memory devices $300_1$ to $300_4$ are mounted, and to which the receiving terminals 301 of the memory devices $300_1$ to $300_4$ are joined. In addition, the respective branch wires $121_1$ to $121_4$ have via conductors $125_1$ to $125_4$ between the outer layer and the inner layer, which are first via conductors that extend to the outer layer 113 from the via conductors 166 to 169 between the inner layers of the main wire 111. In addition, the respective branch wires $121_1$ to $121_4$ have leading wiring patterns $124_1$ to $124_4$ which are formed on the outer layer 113 and are first conductor patterns that electrically connect the electrode pads $123_1$ to $123_4$ with the via conductors $125_1$ to $125_4$ between the outer layer and the inner layer.

Incidentally, the via conductor 166 between the inner layers and the via conductor $125_1$ between the outer layer and the inner layer are integrally formed in the via 132. In addition, the via conductor 167 between the inner layers and the via conductor $125_2$ between the outer layer and the inner layer are integrally formed in the via 133. In addition, the via conductor 168 between the inner layers and the via conductor $125_3$ between the outer layer and the inner layer are integrally formed in the via 134. In addition, the via conductor 169 between the inner layers and the via conductor $125_4$ between the outer layer and the inner layer are integrally formed in the via 135.

The respective branch wires $122_1$ to $122_4$ have electrode pads $126_1$ to $126_4$ of second electrode pads, which are formed on the outer layer 113 on which the corresponding memory devices $300_1$ to $300_4$ are mounted, and to which the receiving terminals 302 of the memory devices $300_1$ to $300_4$ are joined. In addition, the respective branch wires $122_1$ to $122_4$ have via conductors $128_1$ to $128_4$ between the outer layer and the inner layer, which are second via conductors that extend to the outer layer 113 from the via conductors 186 to 189 between the inner layers of the main wire 112. In addition, the respective branch wires $122_1$ to $122_4$ have leading wiring patterns $127_1$ to $127_4$ which are formed on the outer layer 113 and are second conductor patterns that electrically connect the electrode pads $126_1$ to $126_4$ with the via conductors $128_1$ to $128_4$ between the outer layer and the inner layer.

Incidentally, the via conductor 186 between the inner layers and the via conductor $128_1$ between the outer layer and the inner layer are integrally formed in the via 142. In addition, the via conductor 187 between the inner layers and the via conductor $128_2$ between the outer layer and the inner layer are integrally formed in the via 143. In addition, the via conductor 188 between the inner layers and the via conductor $128_3$ between the outer layer and the inner layer are integrally formed in the via 144. In addition, the via conductor 189 between the inner layers and the via conductor $128_4$ between the outer layer and the inner layer are integrally formed in the via 145.

Figure 3:
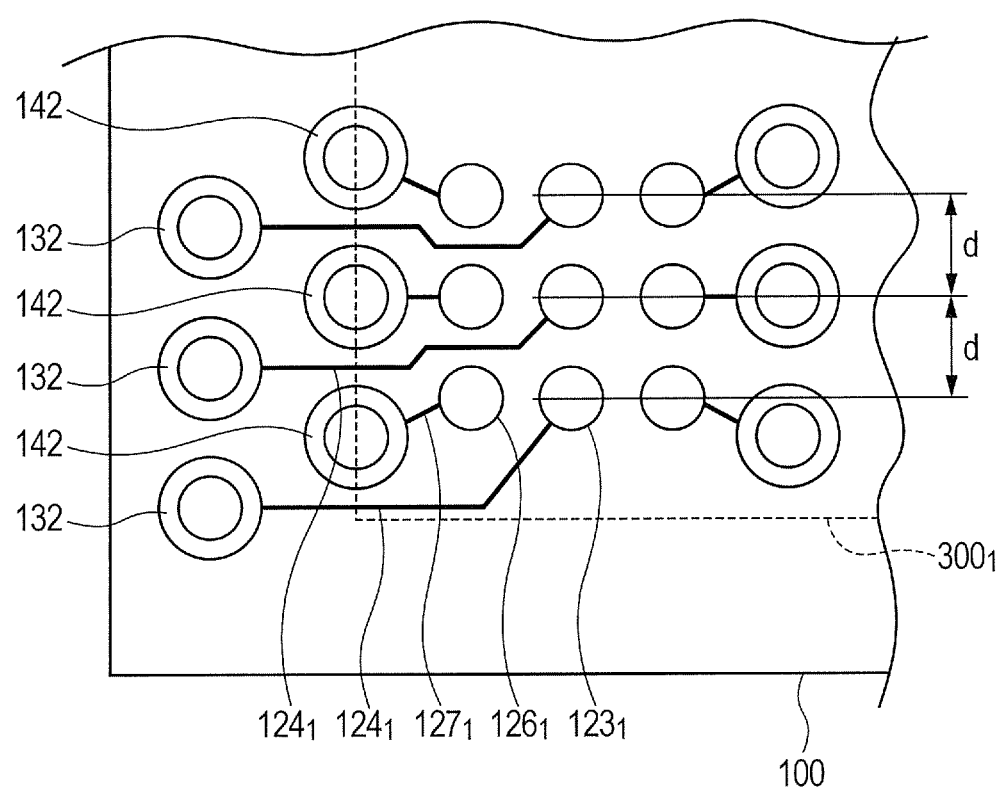
FIG. 3 is a plan view illustrating one part of a printed wiring board of the printed circuit board according to the first embodiment.

FIG. 3 is a plan view illustrating one part of the printed wiring board of the printed circuit board according to the first embodiment of the present invention. Incidentally, FIG. 3 illustrates a portion on which the memory device $300_1$ is mounted, but portions on which other memory devices are mounted have the same configuration as that of the portion, and the illustration will be omitted. The memory devices $300_1$ to $300_4$ are a BGA type of semiconductor package, and accordingly a plurality of electrode pads including the electrode pads $123_1$ and $126_1$ in FIG. 3 are arranged in an arrayed form (tetragonal lattice shape), on the printed wiring board 100. A distance d between the electrode pads is, for instance, 0.8 [mm].

The vias 131 to 136 and 141 to 146 are through hole vias, and the printed wiring board 100 can be manufactured more inexpensively than a build-up wiring board. However, the diameters of the vias 131 to 136 and 141 to 146 are larger than those of the vias in the build-up wiring board. For instance, the diameters of the vias 131 to 136 and 141 to 146 are approximately φ 0.6 [mm], and the diameters of the electrode pads are approximately φ 0.6 [mm]. Because of this, the vias 131 to 136 and 141 to 146 cannot be arranged between the electrode pads, and are arranged in the outside of the electrode pad group. Because of this, the wiring lengths of the leading wiring patterns $124_1$ to $124_4$ and $127_1$ to $127_4$ become longer than those in the build-up wiring board.

Then, the main wire 111 is mainly wired on the inner layer 114 in a section between the memory controller 200 and the via 132. Next, the main wire 111 changes the wiring layer from the inner layer 114 to the inner layer 115 at the via 132, and is wired on the inner layer 115 in a section between the via 132 and the via 133. To the via 132, the leading wiring pattern $124_1$ is connected, and also the electrode pad $123_1$ is connected to which the leading wiring pattern $124_1$ and the receiving terminal 301 of the memory device $300_1$ are joined. Next, the main wire 111 changes the wiring layer from the inner layer 115 to the inner layer 114 at the via 133, and is wired on the inner layer 114 in a section between the via 133 and the via 134. To the via 133, the leading wiring pattern $124_2$ is connected, and also the electrode pad $123_2$ is connected to which the leading wiring pattern $124_2$ and the receiving terminal 301 of the memory device $300_2$ are joined. Next, the main wire 111 changes the wiring layer from the inner layer 114 to the inner layer 115 at the via 134, and is wired on the inner layer 115 in a section between the via 134 and the via 135. To the via 134, the leading wiring pattern $124_3$ is connected, and also the electrode pad $123_3$ is connected to which the leading wiring pattern $124_3$ and the receiving terminal 301 of the memory device $300_3$ are joined. Next, the main wire 111 changes the wiring layer from the inner layer 115 to the inner layer 114 at the via 135, and is wired on the inner layer 114 in a section between the via 135 and the via 136. To the via 135, the leading wiring pattern $124_4$ is connected, and also the electrode pad $123_4$ is connected to which the leading wiring pattern $124_4$ and the receiving terminal 301 of the memory device $300_4$ are joined. Finally, the main wire 111 is wired on the outer layer 113 in a section between the via 136 and the termination resistor 401, and is connected to the termination resistor 401.

On the other hand, the main wire 112 is mainly wired on the inner layer 115 in a section between the memory controller 200 and the via 142. Next, the main wire 112 changes the wiring layer from the inner layer 115 to the inner layer 114 at the via 142, and is wired on the inner layer 114 in a section between the via 142 and the via 143. To the via 142, the leading wiring pattern $127_1$ is connected, and also the electrode pad $126_1$ is connected to which the leading wiring pattern $127_1$ and the receiving terminal 302 of the memory device $300_1$ are joined. Next, the main wire 112 changes the wiring layer from the inner layer 114 to the inner layer 115 at the via 143, and is wired on the inner layer 115 in a section between the via 143 and the via 144. To the via 143, the leading wiring pattern $127_2$ is connected, and also the electrode pad $126_2$ is connected to which the leading wiring pattern $127_2$ and the receiving terminal 302 of the memory device $300_2$ are joined. Next, the main wire 112 changes the wiring layer from the inner layer 115 to the inner layer 114 at the via 144, and is wired on the inner layer 114 in a section between the via 144 and the via 145. To the via 144, the leading wiring pattern $127_3$ is connected, and also the electrode pad $126_3$ is connected to which the leading wiring pattern $127_3$ and the receiving terminal 302 of the memory device $300_3$ are joined. Next, the main wire 112 changes the wiring layer from the inner layer 114 to the inner layer 115 at the via 145, and is wired on the inner layer 115 in a section between the via 145 and the via 146. To the via 145, the leading wiring pattern $127_4$ is connected, and also the electrode pad $126_4$ is connected to which the leading wiring pattern $127_4$ and the receiving terminal 302 of the memory device $300_4$ are joined. Finally, the main wire 112 is wired on the outer layer 113 in a section between the via 146 and the termination resistor 402, and is connected to the termination resistor 402.

Thus, the respective branch wires $121_1$ to $121_4$ are branched from the main wire 111 in the inner layer 114 that is close to the outer layer 113 on which the respective memory devices $300_1$ to $300_4$ are mounted, and accordingly the wiring lengths of the branch wires $121_1$ to $121_4$ become shorter than conventional wiring lengths. Similarly, the respective branch wires $122_1$ to $122_4$ are branched from the main wire 112 on the inner layer 114 that is close to the outer layer 113 on which the respective memory devices $300_1$ to $300_4$ are mounted, and accordingly the wiring lengths of the branch wires $122_1$ to $122_4$ become shorter than the conventional wiring lengths. Specifically, the wiring lengths of the via conductors $125_1$ to $125_4$ and $128_1$ to $128_4$ between the outer layer and the inner layer in the vias 132 to 135 and 142 to 145 become shorter than the conventional wiring lengths. Accordingly, in the memory devices $300_1$ to $300_4$ which are connected to the respective branch wires $121_1$ to $121_4$ and $122_1$ to $122_4$, ringing can be decreased.

Figure 4:
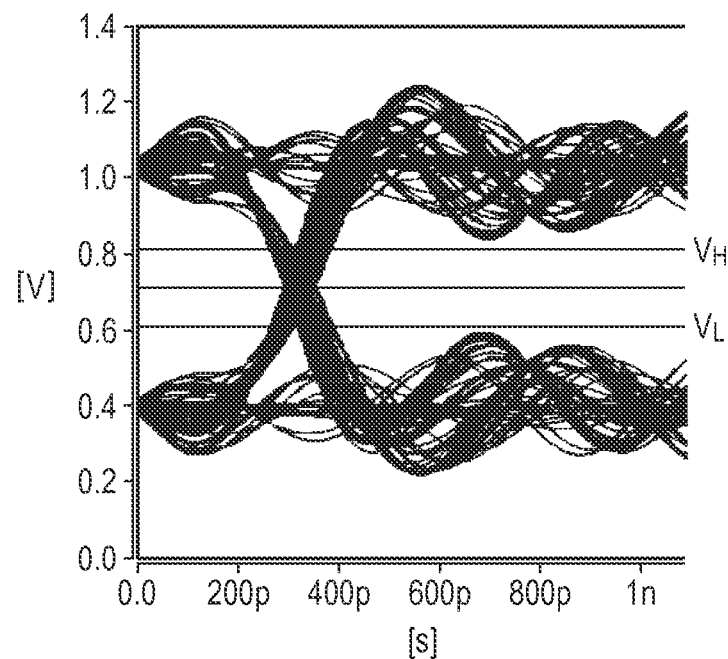
FIG. 4 is a graph illustrating a waveform of a signal in a memory device of the first embodiment.

FIG. 4 is a graph illustrating a waveform of a signal in the memory device $300_1$ in the first embodiment. Incidentally, the waveform of the signal was calculated by computer simulation. HSPICE made by Synopsys, Inc. was used as the simulator.

Each parameter used in the waveform simulation of the present first embodiment is as follows. As for the memory controller 200, output voltage was set at 1.5 [V], a data rate was set at 533 [Mbps], and output impedance was set at 40 [Ω]. As for the inner layer wiring pattern 181 of the main wire 112, line impedance was set at 40 [Ω], and a length of the wire was set at 50 [mm]. As for the inner layer wiring patterns 182 to 184, line impedance was set at 50 [Ω], and the length was set at 16 [mm]. As for the inner layer wiring pattern 185, line impedance was set at 50 [Ω], and the length was set at 20 [mm]. As for the leading wiring patterns $127_1$ to $127_4$, line impedance was set at 50 [Ω], and the length was set at 5 [mm] or shorter. A plate thickness of the printed wiring board 100 was set at 1.6 [mm]. A distance between the outer layer 113 on which the memory devices $300_1$ to $300_4$ were mounted and the inner layer 114 was set at 0.3 [mm], and a distance between the inner layer 114 and the inner layer 115 was set at 1.0 [mm]. The vias 141 to 146 are through hole vias.

An IBIS model of DDR3-SDRAM was used as the memory devices $300_1$ to $300_4$. A resistance value of the termination resistor 402 was set at 39 [Ω].

Figure 12:
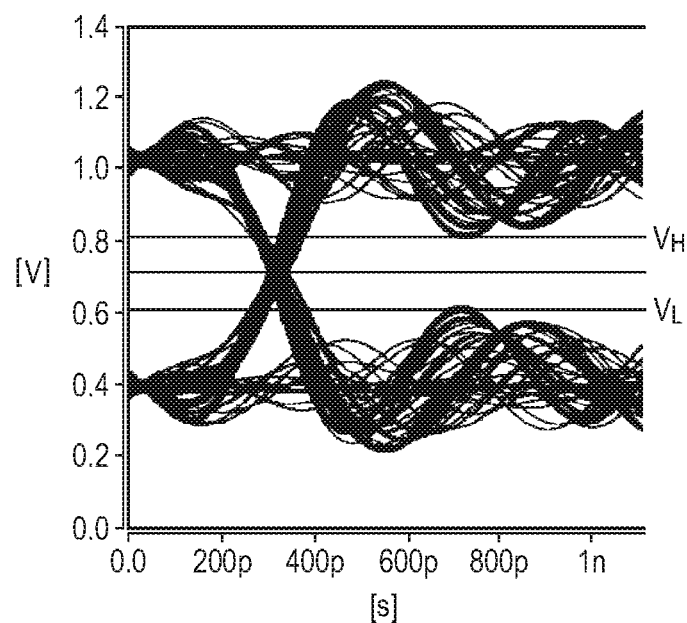
FIG. 12 is a graph illustrating a waveform of a signal in a memory device of a comparative example.
Figure 14A:
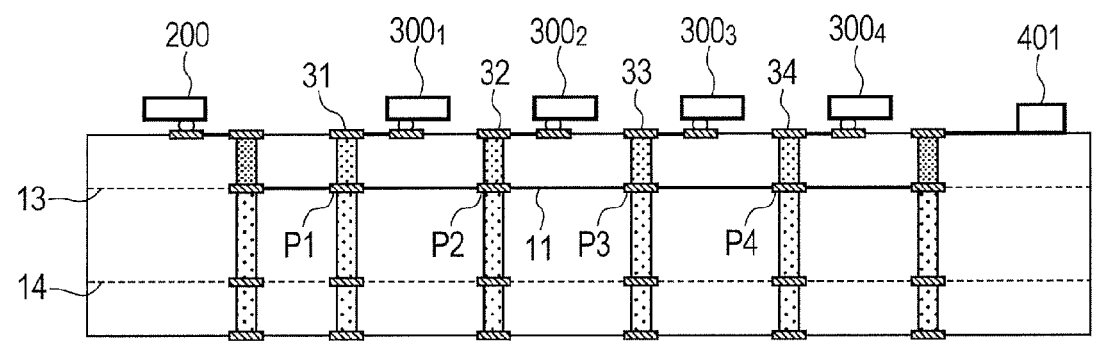
FIGS. 14A and 14B are sectional views illustrating a wiring structure in a conventional printed wiring board.
Figure 14B:
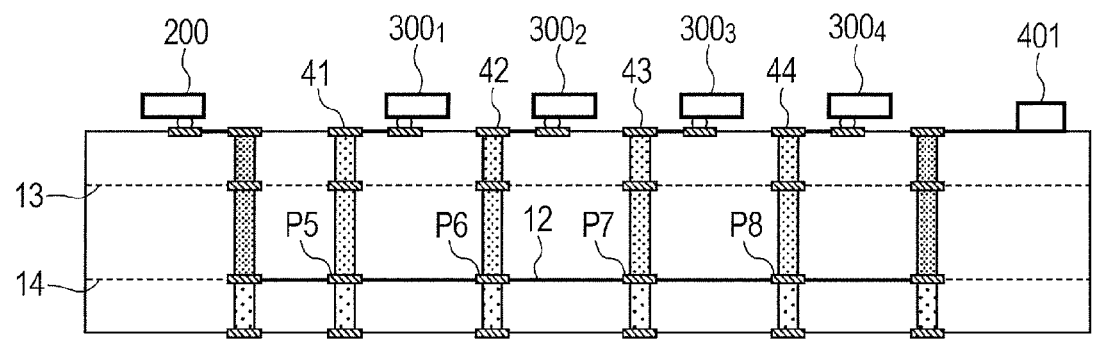

Meanwhile, as a comparative example, a waveform of a signal in the case (corresponding to FIG. 14B) was also calculated by computer simulation, in which all the inner layer wiring patterns 181 to 185 were wired on the inner layer 115 without a change of the wiring layer. FIG. 12 is a graph illustrating a waveform of a signal in a memory device $300_1$ in the comparative example. HSPICE made by Synopsys, Inc. was used as the simulator. Incidentally, the respective parameters used in the waveform simulation of the comparative example were the same as the above described parameters.

In FIG. 4 and FIG. 12, a potential difference between a threshold voltage $V_H$ of a high level and a threshold voltage $V_L$ of a low level is, for instance, 200 [mV], and it is necessary as input voltage conditions that the high level of the signal is higher than the threshold voltage $V_H$ and the low level of the signal is lower than the threshold voltage $V_L$.

As is illustrated in FIG. 12, in the comparative example, even though the signal has been higher than the threshold voltage $V_H$ of the high level, the signal has been occasionally lower than the threshold voltage $V_H$ due to ringing. In addition, even though the signal has been lower than the threshold voltage $V_L$ of the low level, the signal has been occasionally higher than the threshold voltage $V_L$ due to ringing. For this reason, the input voltage conditions of the signal have not been capable of being satisfied. On the contrary, as is illustrated in FIG. 4, it is understood that the ringing is decreased and the input voltage conditions are satisfied, in the present first embodiment.

Next, the wiring length of the branch wire will be described below. The input voltage conditions of the signal are described in 8.1.1 of Document NPL 2. In order that the input voltage conditions of the signal are satisfied, the wiring lengths of the branch wires $121_1$ to $121_4$ and $122_1$ to $122_4$ can be set at 5 [mm] or shorter.

Figure 5:
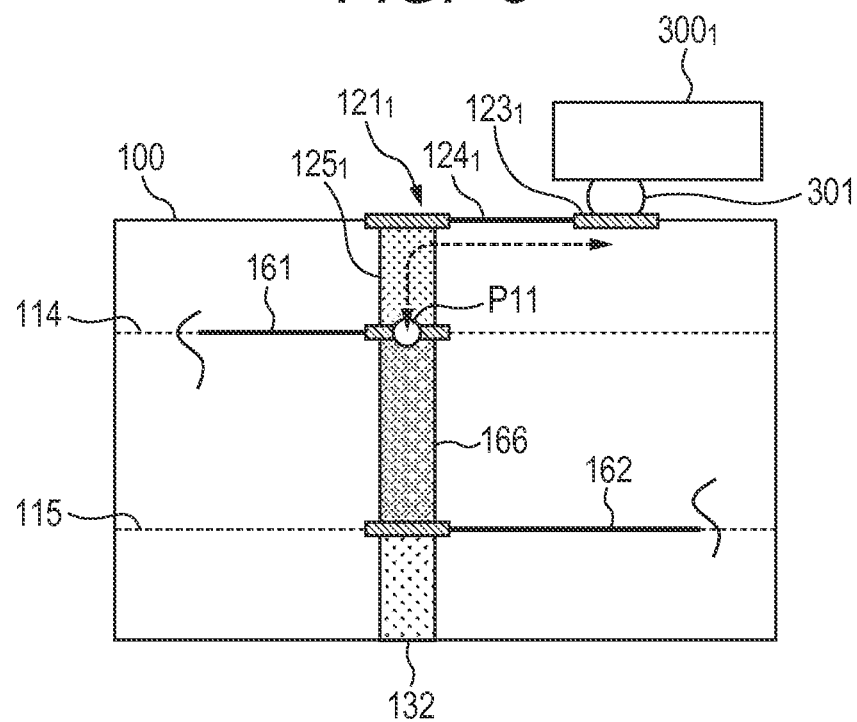
FIG. 5 is an enlarged sectional view illustrating the vicinity of the memory device of the printed circuit board.

FIG. 5 is an enlarged sectional view illustrating the vicinity of the memory device $300_1$ of the printed circuit board 500. The wiring length of the branch wire $121_1$ is the length from the branch point P11 to the receiving terminal 301 of the memory device $300_1$, which is shown by the dashed arrow.

Figure 6A:
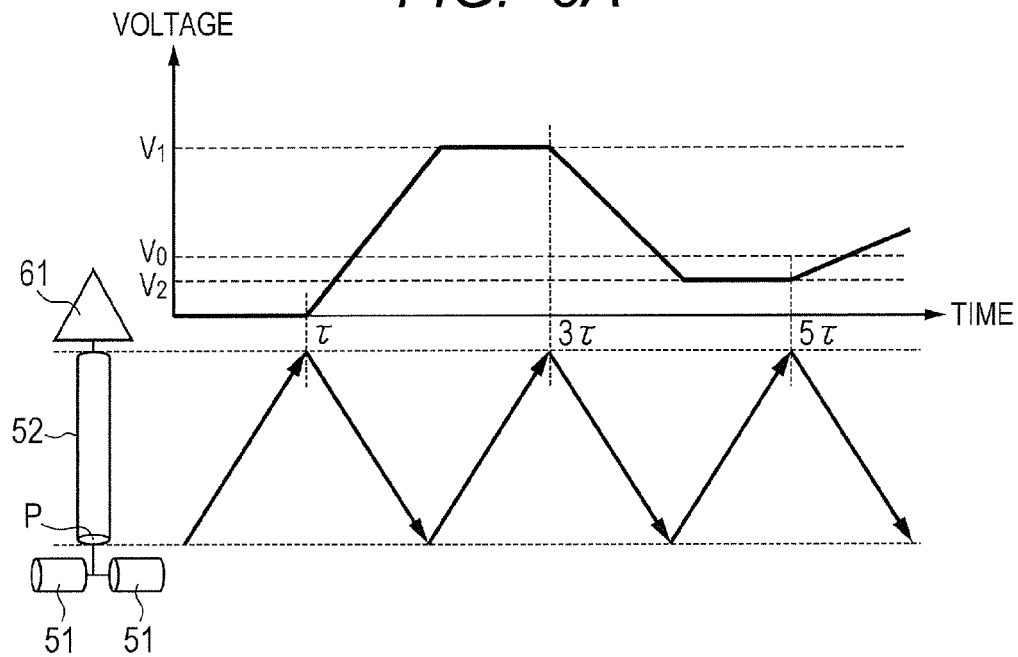
FIGS. 6A and 6B are schematic views illustrating a length of a branch wire and a waveform which is observed in the memory device.
Figure 6B:
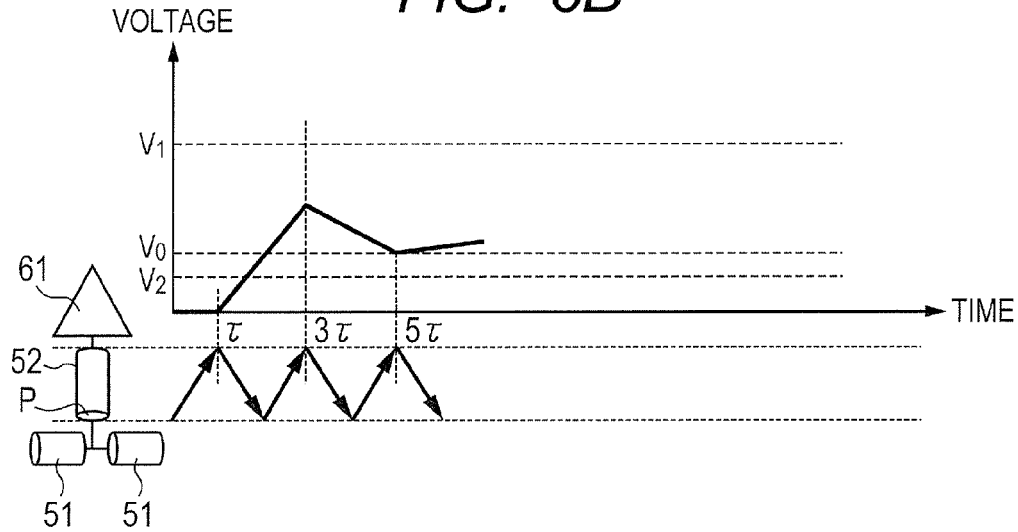

FIGS. 6A and 6B are schematic views illustrating the length of the branch wire and a waveform which is observed in the memory device. FIG. 6A illustrates the case of a wiring length with which the branch wire cannot satisfy the input voltage conditions; and FIG. 6B illustrates the case of a wiring length with which the branch wire satisfies the input voltage conditions.

In FIGS. 6A and 6B, a memory device 61 working as a receiving element is electrically connected to a main wire 51 by a branch wire 52 which is branched at a branch point P.

As is illustrated in FIG. 6A, in the case of the wiring length with which the branch wire 52 cannot satisfy the input voltage conditions, when a forward wave reaches a receiving end of the memory device 61 at the time τ, the waveform rises and reaches an overshoot voltage $V_1$ which is given by Expression (1).

$$V_1 = \frac{2Z_2}{Z_1 + Z_2} \times V_{in} \quad \text{Expression 1}$$

In the above expression, $Z_1$ represents a line impedance of the branch wire 52, and $Z_2$ represents a line impedance of the main wire 51 when viewed from the branch wire 52. $V_{in}$ represents a voltage which is input into the branch wire 52 from the main wire 51. A reflection coefficient of the receiving end of the memory device 61 was determined to be 1.

When the forward wave is reflected on the receiving end at the time τ and the reflected wave reaches the receiving end again at the time 3τ, the waveform falls to a ringback voltage $V_2$ which is given by Expression (2)

$$V_2 = \frac{4Z_1 Z_2}{(Z_1 + Z_2)^2} \times V_{in} \quad \text{Expression 2}$$

When the reflected wave reaches the receiving end at the time 5τ, the waveform rises again by the reflected wave.

As is illustrated in FIG. 6B, in the case of the wiring length with which the branch wire 52 satisfies the input voltage conditions, the waveform rises before reaching the ringback voltage, and accordingly the ringback voltage decreases.

Figure 7:
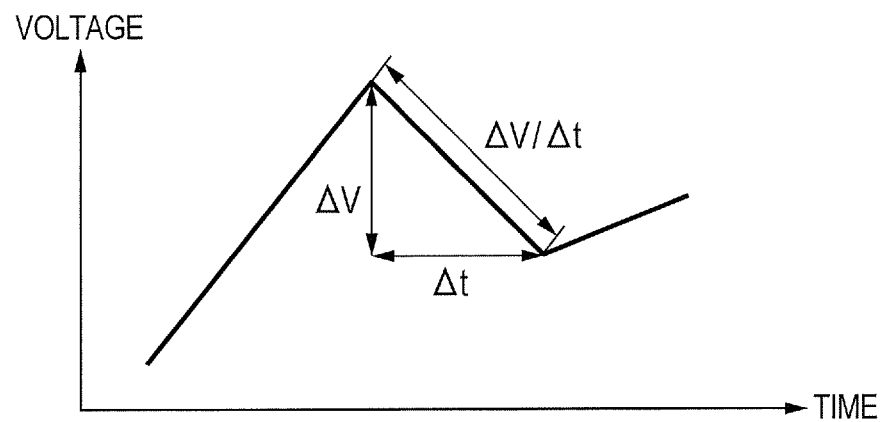
FIG. 7 is a schematic view illustrating a potential difference $\Delta V$ of allowable ringing, and a slope $\Delta V/\Delta t$ of the waveform.

FIG. 7 is a schematic view illustrating a potential difference ΔV of allowable ringing, and a slope ΔV/Δt of the waveform. FIG. 7 illustrates a period of time Δt during which a reflected wave reciprocates between the branch point P11 and the receiving terminal 301 of the memory device $300_1$, which are illustrated in FIG. 5. A distance between the branch point P11 and the receiving terminal 301 of the memory device $300_1$ is determined from the reciprocation period of time Δt.

It takes approximately 200 [psec] for the overshoot voltage to fall from 1.2 [V] to 0.8125 [V] which is the input voltage condition with a slope of 2 [V/nsec]. The value is the period of time during which the reflected wave reciprocates between the branch point P11 and the receiving terminal 301 of the memory device $300_1$. The transmitting velocity of the signal of the printed wiring board 100 is 6.6 [psec/mm], and accordingly the length becomes 15 [mm]. In 15 [mm], the wiring length (wiring length of semiconductor package) in the inside of the memory device $300_1$ is included. The wiring length in the inside of the memory device $300_1$ was 10 [mm] according to the parameter of the package described in the IBIS model of DDR3-SDRAM. It is understood from the wiring length that if the wiring lengths of the branch wires $121_1$ to $121_4$ and $122_1$ to $122_4$ are each 5 [mm] or shorter, the input voltage condition is satisfied.

As has been described above, according to the present first embodiment, a fly-by wiring structure can be provided that secures the operation stability in an inexpensive printed wiring board 100 which has large diameters of the vias 131 to 136 and 141 to 146. In addition, the wiring lengths of the respective branch wires $121_1$ to $121_4$ and $122_1$ to $122_4$ become short, which are more specifically the wiring lengths of the via conductors $125_1$ to $125_4$ and $128_1$ to $128_4$ between the outer layer and the inner layer. Thereby, the print circuit board can reduce ringing in the respective memory devices $300_1$ to $300_4$, and can satisfy the input voltage conditions of the signal (the address command signal of DDR3 memory). The branch wires $121_1$ to $121_4$ and $122_1$ to $122_4$ are branched at the inner layer 114, and accordingly the main wire does not need to be drawn out to an outer layer through the via and also to be drawn back to the inner layer through the via as in the conventional one. Accordingly, the number of the vias can be reduced, and an inexpensive printed wiring board 100 can be achieved.

Figure 8:
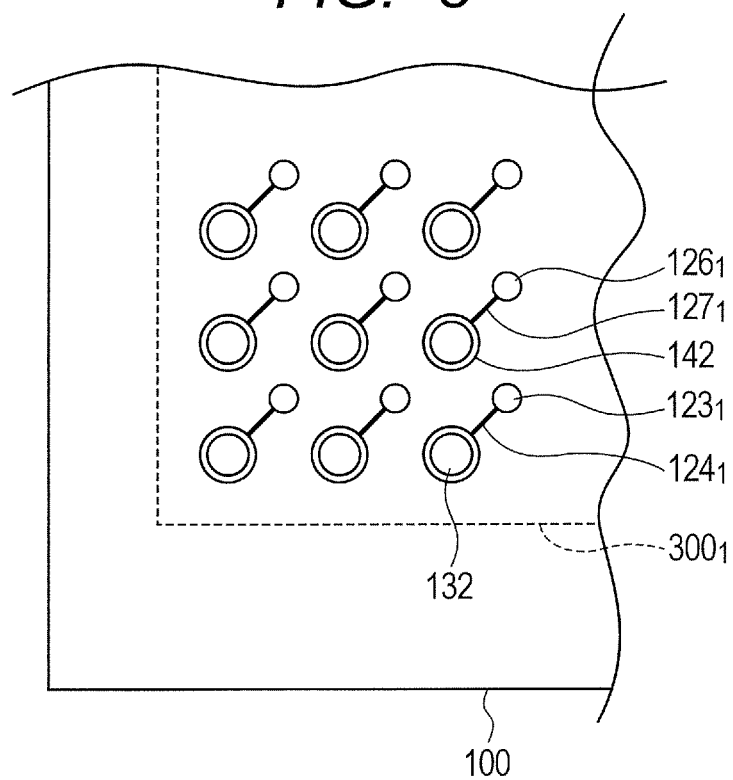
FIG. 8 is a plan view illustrating one part of the printed wiring board of the printed circuit board according to the first embodiment.

Incidentally, the case has been described in which the vias 132 and 142 in the printed wiring board 100 are arranged in the outside of the electrode pad group, but the via 142 (or via 132) may be arranged between the electrode pads, for instance, as is illustrated in FIG. 8. In this case, a build-up substrate or the like needs to be employed as the printed wiring board so as to make the diameter of the via small, and the cost may increase, but the leading wiring pattern can be further shortened, which is the leading wiring patterns $124_1$ and $127_1$ in FIG. 8. Accordingly, the branch wire can be further shortened.

Second Embodiment

Figure 9A:
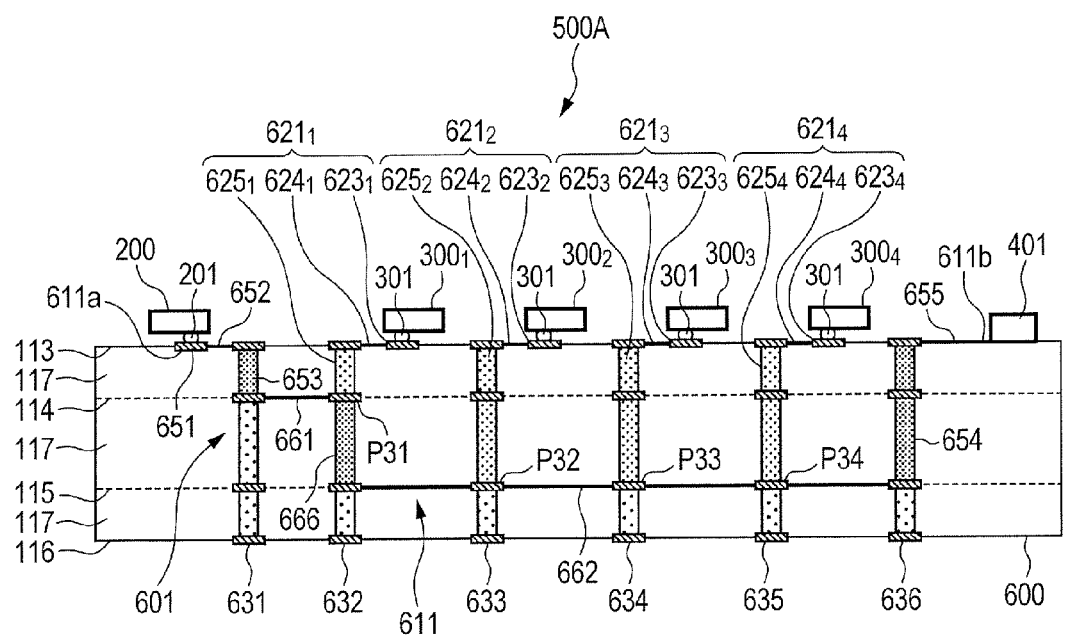
FIGS. 9A and 9B are sectional views of a printed circuit board according to a second embodiment.
Figure 9B:
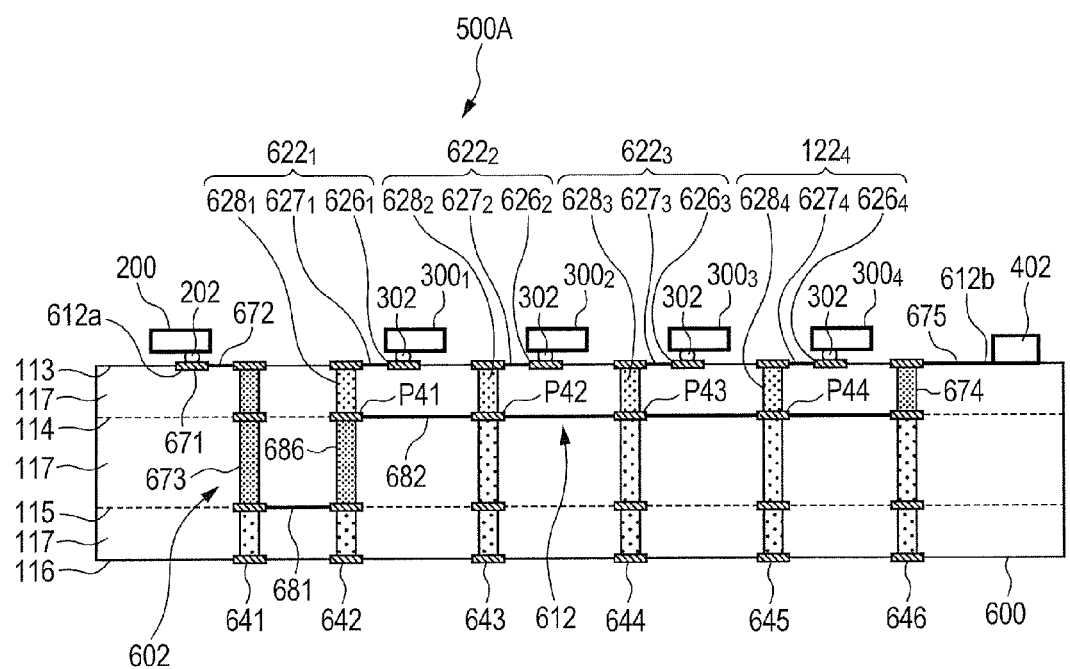

Next, a printed circuit board according to a second embodiment of the present invention will be described below. FIGS. 9A and 9B are sectional views of the printed circuit board according to the second embodiment of the present invention. Incidentally, configurations similar to those in the above described first embodiment are designated by the same reference numerals, and the description will be omitted.

A printed circuit board 500A of the present second embodiment has a printed wiring board 600, and a memory controller 200 as a transmitting element mounted on the printed wiring board 600. In addition, the printed circuit board 500A has a plurality (four in the present second embodiment) of memory devices $300_1$, $300_2$, $300_3$ and $300_4$ as receiving elements.

The printed wiring board 600 has a plurality of address command wires which connect the transmission terminals 201 and 202 of the memory controller 200 with the receiving terminals 301 and 302 of the respective memory devices $300_1$ to $300_4$ by a topology that is referred to as fly-by. The plurality of the address command wires is formed of an address command wire (first address command wire) 601 which belongs to a first group, and an address command wire (second address command wire) 602 which belongs to a second group. FIG. 9A illustrates one address command wire 601; and FIG. 9B illustrates one address command wire 602.

The address command wire 601 includes a main wire (first main wire) 611, and a plurality (four in the present second embodiment) of branch wires (first branch wires) $621_1$, $621_2$, $621_3$ and $621_4$, as is illustrated in FIG. 9A. The address command wire 602 includes a main wire (second main wire) 612, and a plurality (four in the present second embodiment) of branch wires (second branch wires) $622_1$, $622_2$, $622_3$ and $622_4$, as is illustrated in FIG. 9B.

The main wire 611 is formed in series; and has a starting end 611a electrically connected to a transmission terminal (first transmission terminal) 201 of the memory controller 200 and a termination 611b electrically connected to one end of a termination resistor 401. Similarly, the main wire 612 is formed in series; and has a starting end 612a electrically connected to a transmission terminal (second transmission terminal) 202 of the memory controller 200 and a termination 612b electrically connected to one end of a termination resistor 402.

The respective branch wires $621_1$ to $621_4$ are branched from branch points P31, P32, P33 and P34 which are different from each other in the main wire 611, and are electrically connected to receiving terminals (first receiving terminals) 301 of the corresponding memory devices out of four memory devices $300_1$ to $300_4$, respectively. The respective branch wires $622_1$ to $622_4$ are branched from branch points P41, P42, P43 and P44 which are different from each other in the main wire 612, and are electrically connected to receiving terminals (second receiving terminals) 302 of the corresponding memory devices out of four memory devices $300_1$ to $300_4$, respectively. Specifically, one ends of the respective branch wires $621_1$ to $621_4$ are electrically connected to the respective branch points P31 to P34, and the other ends are electrically connected to the receiving terminals 301 of the respective memory devices $300_1$ to $300_4$. In addition, one ends of the respective branch wires $622_1$ to $622_4$ are electrically connected to the respective branch points P41 to P44, and the other ends are electrically connected to the receiving terminals 302 of the respective memory devices $300_1$ to $300_4$.

The memory controller 200, the respective memory devices $300_1$ to $300_4$, and the respective termination resistors 401 and 402 are mounted on the outer layer 113.

As is illustrated in FIG. 9A, the printed wiring board 600 has a plurality (six) of vias 631 to 636 for the address command wire 601 formed therein, which penetrate layers from the outer layer 113 to the outer layer 116, and have conductors provided in the inner perimeter surfaces thereof. In addition, as is illustrated in FIG. 9B, the printed wiring board 600 has a plurality (six) of vias 641 to 646 for the address command wire 602 formed therein, which penetrate layers from the outer layer 113 to the outer layer 116, and have conductors provided in the inner perimeter surfaces thereof.

The main wire 611 that is the first main wire has an electrode pad 651 which is formed on the outer layer 113 and is joined to the transmission terminal 201 of the memory controller 200, and an outer layer wiring pattern 652 which extends from the electrode pad 651. In addition, the main wire 611 has an outer layer wiring pattern 655 which extends from one end of the termination resistor 401. In addition, the main wire 611 has inner layer wiring patterns 661 and 662 that are a plurality (two in the present embodiment) of first inner layer wiring patterns which are wired on the inner layer 114 and the inner layer 115 so as to change layers between the inner layer 114 and the inner layer 115, from the starting end 611a toward the termination 611b. In addition, the main wire 611 has a via conductor 666 between the inner layers, which connects two inner layer wiring patterns 661 and 662 in series, and is one first via conductor between the inner layers. In addition, the main wire 611 has a via conductor 653 between an outer layer and an inner layer, which connects the outer layer wiring pattern 652 with the inner layer wiring pattern 661, and has a via conductor 654 between the outer layer and the inner layer, which connects the inner layer wiring pattern 662 with the outer layer wiring pattern 655.

The via conductor 666 between the inner layers is a conductor in a portion between the inner layer 114 and the inner layer 115, in the via 632. The via conductor 653 between the outer layer and the inner layer is a conductor in a portion between the outer layer 113 and the inner layer 114, in the via 631, and the via conductor 654 between the outer layer and the inner layer is a conductor in a portion between the outer layer 113 and the inner layer 115, in the via 636.

In addition, the main wire 612 that is the second main wire has an electrode pad 671 which is formed on the outer layer 113 and is joined to the transmission terminal 202 of the memory controller 200, and an outer layer wiring pattern 672 which extends from the electrode pad 671. In addition, the main wire 612 has an outer layer wiring pattern 675 which extends from one end of the termination resistor 402. In addition, the main wire 612 has inner layer wiring patterns 681 and 682 that are a plurality (two in the present embodiment) of second inner layer wiring patterns which are wired on the inner layer 114 and the inner layer 115 so as to change layers between the inner layer 114 and the inner layer 115, from the starting end 612a toward the termination 612b. In addition, the main wire 612 has a via conductor 686 between the inner layers, which connects two inner layer wiring patterns 681 and 682 in series, and is one second via conductor between the inner layers. In addition, the main wire 612 has a via conductor 673 between the outer layer and the inner layer, which connects the outer layer wiring pattern 672 with the inner layer wiring pattern 681, and has a via conductor 674 between the outer layer and the inner layer, which connects the inner layer wiring pattern 682 with the outer layer wiring pattern 675.

The via conductor 686 between the inner layers is a conductor in a portion between the inner layer 114 and the inner layer 115, in the via 642. The via conductor 673 between the outer layer and the inner layer is a conductor in a portion between the outer layer 113 and the inner layer 115, in the via 641, and the via conductor 674 between the outer layer and the inner layer is a conductor in a portion between the outer layer 113 and the inner layer 114, in the via 646.

The main wire 611 is wired so as to change the layers, in such a way that the inner layer wiring pattern 661 is formed on the inner layer 114 and the inner layer wiring pattern 662 is formed on the inner layer 115. In addition, the main wire 612 is wired so as to change the layers, in such a way that the inner layer wiring pattern 681 is formed on the inner layer 115 and the inner layer wiring pattern 682 is formed on the inner layer 114. Thus, the inner layer wiring patterns 681 and 682 of the main wire 612 are wired so as to change the layer to the inner layer on the opposite side to that of the inner layer wiring patterns 661 and 662 of the main wire 611, from the starting end 612a toward the termination 612b.

At least the branch wire $621_1$ out of the plurality of the branch wires $621_1$ to $621_4$, which is branched from the branch point P31 that is closest to the starting end 611a of the main wire 611, is electrically connected to the via conductor 666 between the inner layers of the main wire 611, in the present second embodiment. Specifically, one end of the branch wire $621_1$ is electrically connected to one end of the via conductor 666 between the inner layers of the main wire 611. One end of the via conductor 666 between the inner layers is an end in a side of the inner layer 114 that is close to the outer layer 113 on which the memory device $300_1$ is mounted. The branch wires $621_2$ to $621_4$ are connected to intermediate portions between both ends of the inner layer wiring pattern 662.

Similarly, at least the branch wire $622_1$ out of the plurality of the branch wires $622_1$ to $622_4$, which is branched from the branch point P41 that is closest to the starting end 612a of the main wire 612, is electrically connected to the via conductor 686 between the inner layers of the main wire 612, in the present second embodiment. Specifically, one end of the branch wire $622_1$ is electrically connected to one end of the via conductor 686 between the inner layers of the main wire 612. One end of the via conductor 686 between the inner layers is an end in a side of the inner layer 114 that is close to the outer layer 113 on which the memory device $300_1$ is mounted. The branch wires $622_2$ to $622_4$ are connected to intermediate portions between both ends of the inner layer wiring pattern 682.

The respective branch wires $621_1$ to $621_4$ have electrode pads $623_1$ to $623_4$ of first electrode pads, which are formed on the outer layer 113 on which the corresponding memory devices $300_1$ to $300_4$ are mounted, and to which the receiving terminals 301 of the memory devices $300_1$ to $300_4$ are joined.

In addition, the branch wire $621_1$ has a via conductor $625_1$ between the outer layer and the inner layer, which is a first via conductor that extends to the outer layer 113 from the via conductor 666 between the inner layers of the main wire 611. The respective branch wires $621_2$ to $621_4$ have via conductors $625_2$ to $625_4$ between the outer layer and the inner layer, which are first via conductors that extend to the outer layer 113 from the inner layer wiring pattern 662 of the main wire 611.

In addition, the respective branch wires $621_1$ to $621_4$ have leading wiring patterns $624_1$ to $624_4$ which are formed on the outer layer 113 and are first conductor patterns that electrically connect the electrode pads $623_1$ to $623_4$ with the via conductors $625_1$ to $625_4$ between the outer layer and the inner layer.

Incidentally, the via conductor 666 between the inner layers and the via conductor $625_1$ between the outer layer and the inner layer are integrally formed in the via 632.

The respective branch wires $622_1$ to $622_4$ have electrode pads $626_1$ to $626_4$ of second electrode pads, which are formed on the outer layer 113 on which the corresponding memory devices $300_1$ to $300_4$ are mounted, and to which the receiving terminals 302 of the memory devices $300_1$ to $300_4$ are joined.

In addition, the branch wire $622_1$ has a via conductor $628_1$ between the outer layer and the inner layer, which is a second via conductor that extends to the outer layer 113 from the via conductor 686 between the inner layers of the main wire 612. The respective branch wires $622_2$ to $622_4$ have via conductors $628_2$ to $628_4$ between the outer layer and the inner layer, which are second via conductors that extend to the outer layer 113 from the inner layer wiring pattern 682 of the main wire 612.

In addition, the respective branch wires $622_1$ to $622_4$ have leading wiring patterns $627_1$ to $627_4$ which are formed on the outer layer 113 and are second conductor patterns that electrically connect the electrode pads $626_1$ to $626_4$ with the via conductors $628_1$ to $628_4$ between the outer layer and the inner layer.

Incidentally, the via conductor 686 between the inner layers and the via conductor $628_1$ between the outer layer and the inner layer are integrally formed in the via 642.

According to the present second embodiment, a fly-by wiring structure can be provided that secures the operation stability in an inexpensive printed wiring board 600 which has large diameters of the vias 631 to 636 and 641 to 646.

The ringing which is observed in the memory devices $300_1$ to $300_4$ tends to increase more in a memory device closer to the memory controller 200. Because of this, in the present second embodiment, the wiring lengths of the branch wires $621_1$ and $622_1$ are shortened that are branched from the branch points P31 and P41 closest to the memory controller 200, specifically, closest to the starting ends 611a and 612a, which are specifically the wiring lengths of via conductors $625_1$ and $628_1$ between the outer layer and the inner layer. Thereby, the ringing in the memory device $300_1$ can be effectively decreased. As a result, the printed circuit board can satisfy the input voltage conditions of the memory device $300_1$ of which the waveform tends to be most easily turbulent.

Third Embodiment

Figure 10A:
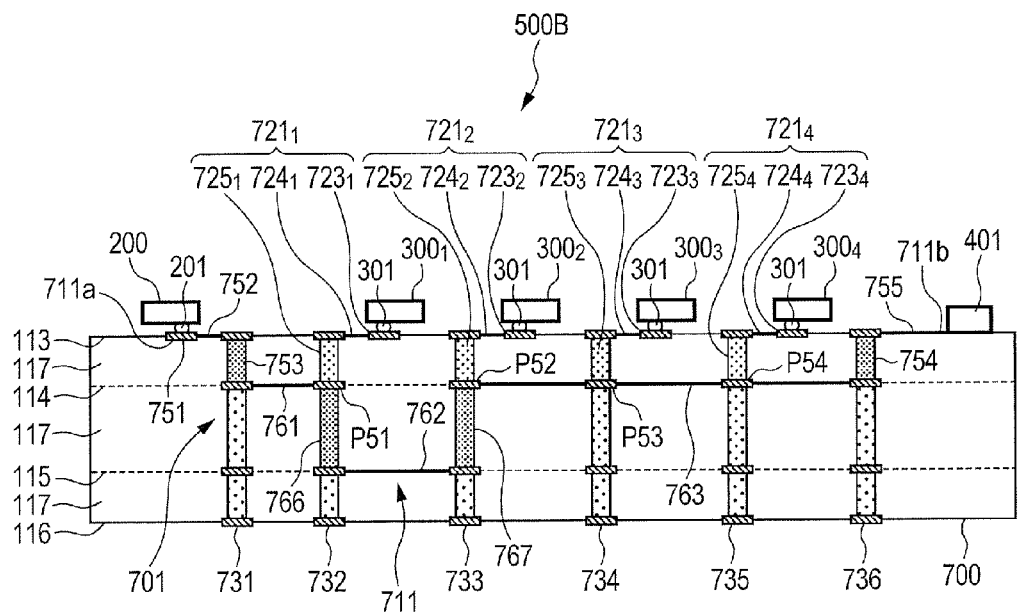
FIGS. 10A and 10B are sectional views of a printed circuit board according to a third embodiment.
Figure 10B:
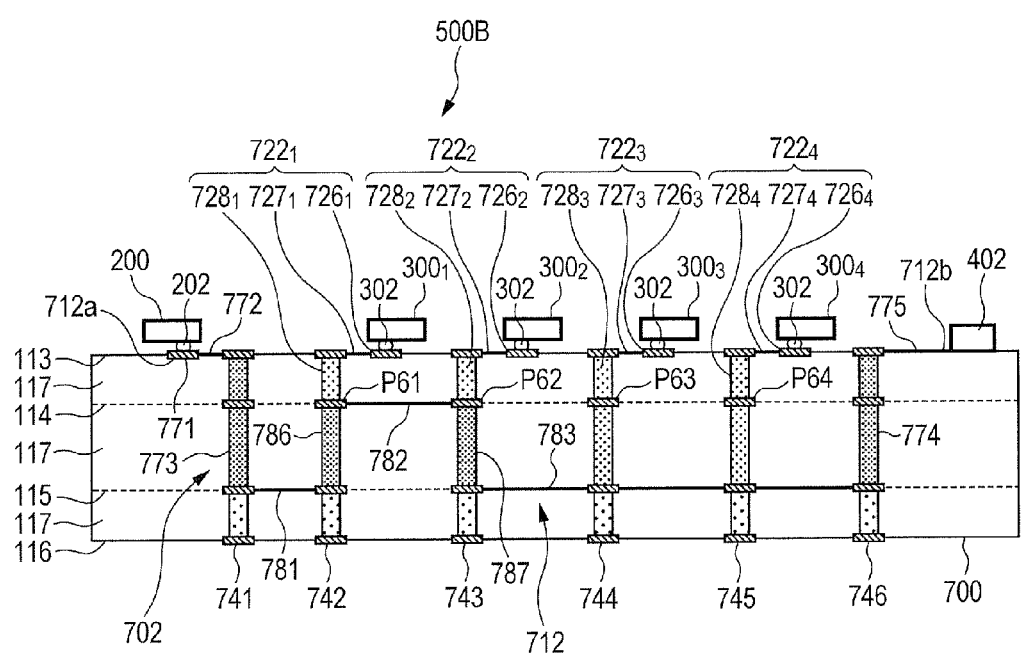

Next, a printed circuit board according to a third embodiment of the present invention will be described below. FIGS. 10A and 10B are sectional views of the printed circuit board according to the third embodiment of the present invention. Incidentally, configurations similar to those in the above described first embodiment are designated by the same reference numerals, and the description will be omitted.

A printed circuit board 500B of the present third embodiment has a printed wiring board 700, and a memory controller 200 as a transmitting element mounted on the printed wiring board 700. In addition, the printed circuit board 500B has a plurality (four in the present third embodiment) of memory devices $300_1$, $300_2$, $300_3$ and $300_4$ as receiving elements.

The printed wiring board 700 has a plurality of address command wires which connect the transmission terminals 201 and 202 of the memory controller 200 with the receiving terminals 301 and 302 of the respective memory devices $300_1$ to $300_4$ by a topology that is referred to as fly-by. The plurality of the address command wires is formed of an address command wire (first address command wire) 701 which belongs to a first group, and an address command wire (second address command wire) 702 which belongs to a second group. FIG. 10A illustrates one address command wire 701; and FIG. 10B illustrates one address command wire 702.

The address command wire 701 includes a main wire (first main wire) 711, and a plurality (four in the present third embodiment) of branch wires (first branch wires) $721_1$, $721_2$, $721_3$ and $721_4$, as is illustrated in FIG. 10A. The address command wire 702 includes a main wire (second main wire) 712, and a plurality (four in the present third embodiment) of branch wires (second branch wires) $722_1$, $722_2$, $722_3$ and $722_4$, as is illustrated in FIG. 10B.

The main wire 711 is formed in series; and has a starting end 711a electrically connected to a transmission terminal (first transmission terminal) 201 of the memory controller 200 and a termination 711b electrically connected to one end of a termination resistor 401. Similarly, the main wire 712 is formed in series; and has a starting end 712a electrically connected to a transmission terminal (second transmission terminal) 202 of the memory controller 200 and a termination 712b electrically connected to one end of a termination resistor 402.

The respective branch wires $721_1$ to $721_4$ are branched from branch points P51, P52, P53 and P54 which are different from each other in the main wire 711, and are electrically connected to receiving terminals (first receiving terminals) 301 of the corresponding memory devices out of four memory devices $300_1$ to $300_4$, respectively. The respective branch wires $722_1$ to $722_4$ are branched from branch points P61, P62, P63 and P64 which are different from each other in the main wire 712, and are electrically connected to receiving terminals (second receiving terminals) 302 of the corresponding memory devices out of four memory devices $300_1$ to $300_4$, respectively. Specifically, one ends of the respective branch wires $721_1$ to $721_4$ are electrically connected to the respective branch points P51 to P54, and the other ends are electrically connected to the receiving terminals 301 of the respective memory devices $300_1$ to $300_4$. In addition, one ends of the respective branch wires $722_1$ to $722_4$ are electrically connected to the respective branch points P61 to P64, and the other ends are electrically connected to the receiving terminals 302 of the respective memory devices $300_1$ to $300_4$.

The memory controller 200, the respective memory devices $300_1$ to $300_4$, and the respective termination resistors 401 and 402 are mounted on the outer layer 113.

As is illustrated in FIG. 10A, the printed wiring board 700 has a plurality (six) of vias 731 to 736 for the address command wire 701 formed therein, which penetrate layers from the outer layer 113 to the outer layer 116, and have conductors provided in the inner perimeter surfaces thereof. In addition, as is illustrated in FIG. 10B, the printed wiring board 700 has a plurality (six) of vias 741 to 746 for the address command wire 702 formed therein, which penetrate layers from the outer layer 113 to the outer layer 116, and have conductors provided in the inner perimeter surfaces thereof.

The main wire 711 that is the first main wire has an electrode pad 751 which is formed on the outer layer 113 and is joined to the transmission terminal 201 of the memory controller 200, and an outer layer wiring pattern 752 which extends from the electrode pad 751. In addition, the main wire 711 has an outer layer wiring pattern 755 which extends from one end of the termination resistor 401. In addition, the main wire 711 has inner layer wiring patterns 761 to 763 that are a plurality (three in the present embodiment) of first inner layer wiring patterns which are wired on the inner layer 114 and the inner layer 115 so as to change layers between the inner layer 114 and the inner layer 115, from the starting end 711a toward the termination 711b. In addition, the main wire 711 has via conductors 766 and 767 between the inner layers, which connect three inner layer wiring patterns 761 to 763 in series, and are two first via conductors between the inner layers. In addition, the main wire 711 has a via conductor 753 between an outer layer and an inner layer, which connects the outer layer wiring pattern 752 with the inner layer wiring pattern 761, and has a via conductor 754 between the outer layer and the inner layer, which connects the inner layer wiring pattern 763 with the outer layer wiring pattern 755.

These via conductors 766 and 767 between the inner layers are conductors in portions between the inner layer 114 and the inner layer 115, in the vias 732 and 733. The via conductor 753 between the outer layer and the inner layer is a conductor in a portion between the outer layer 113 and the inner layer 114, in the via 731, and the via conductor 754 between the outer layer and the inner layer is a conductor in a portion between the outer layer 113 and the inner layer 114, in the via 736.

In addition, the main wire 712 that is the second main wire has an electrode pad 771 which is formed on the outer layer 113 and is joined to the transmission terminal 202 of the memory controller 200, and an outer layer wiring pattern 772 which extends from the electrode pad 771. In addition, the main wire 712 has an outer layer wiring pattern 775 which extends from one end of the termination resistor 402. In addition, the main wire 712 has inner layer wiring patterns 781 to 783 that are a plurality (three in the present embodiment) of second inner layer wiring patterns which are wired on the inner layer 114 and the inner layer 115 so as to change layers between the inner layer 114 and the inner layer 115, from the starting end 712a toward the termination 712b. In addition, the main wire 712 has via conductors 786 and 787 between the inner layers, which connect three inner layer wiring patterns 781 to 783 in series, and are two second via conductors between the inner layers. In addition, the main wire 712 has a via conductor 773 between an outer layer and an inner layer, which connects the outer layer wiring pattern 772 with the inner layer wiring pattern 781, and has a via conductor 774 between the outer layer and the inner layer, which connects the inner layer wiring pattern 783 with the outer layer wiring pattern 775.

These via conductors 786 and 787 between the inner layers are conductors in portions between the inner layer 114 and the inner layer 115, in the vias 742 and 743. The via conductor 773 between the outer layer and the inner layer is a conductor in a portion between the outer layer 113 and the inner layer 115, in the via 741, and the via conductor 774 between the outer layer and the inner layer is a conductor in a portion between the outer layer 113 and the inner layer 115, in the via 746.

The main wire 711 is wired so as to alternately change the layers, in such a way that the inner layer wiring pattern 761 is formed on the inner layer 114, the inner layer wiring pattern 762 is formed on the inner layer 115, and the inner layer wiring pattern 763 is formed on the inner layer 114. In addition, the main wire 712 is wired so as to alternately change the layers, in such a way that the inner layer wiring pattern 781 is formed on the inner layer 115, the inner layer wiring pattern 782 is formed on the inner layer 114, and the inner layer wiring pattern 783 is formed on the inner layer 115. Thus, the inner layer wiring patterns 781 to 783 of the main wire 712 are wired so as to alternately change the layer to the inner layer on the opposite side to that of the inner layer wiring patterns 761 to 763 of the main wire 711, from the starting end 712a toward the termination 712b.

At least the branch wire $721_1$ out of the plurality of the branch wires $721_1$ to $721_4$, which is branched from the branch point P51 that is closest to the starting end 711a of the main wire 711, is electrically connected to the via conductor between the inner layers of the main wire 711. In the present third embodiment, the branch wire $721_1$ which is branched from the branch point P51 that is closest to the starting end 711a of the main wire 711, and the branch wire $721_2$ which is branched from the branch point P52 that is secondly closest to the starting end 711a of the main wire 711 are connected to the respective via conductors 766 and 767 between the inner layers. Specifically, one ends of the respective branch wires $721_1$ and $721_2$ are electrically connected to one ends of the respective via conductors 766 and 767 between the inner layers of the main wire 711. One ends of the via conductors 766 and 767 between the inner layers are ends in a side of the inner layer 114 that is close to the outer layer 113 on which the memory devices $300_1$ and $300_2$ are mounted. The branch wires $721_3$ and $721_4$ are connected to intermediate portions between both ends of the inner layer wiring pattern 763.

Similarly, at least the branch wire $722_1$ out of the plurality of the branch wires $722_1$ to $722_4$, which is branched from the branch point P61 that is closest to the starting end 712a of the main wire 712, is electrically connected to the via conductor between the inner layers of the main wire 712. In the present third embodiment, the branch wire $722_1$ which is branched from the branch point P61 that is closest to the starting end 712a of the main wire 712, and the branch wire $722_2$ which is branched from the branch point P62 that is secondly closest to the starting end 712a of the main wire 712 are connected to the respective via conductors 786 and 787 between the inner layers. Specifically, one ends of the respective branch wires $722_1$ and $722_2$ are electrically connected to one ends of the respective via conductors 786 and 787 between the inner layers of the main wire 712. One ends of the via conductors 786 and 787 between the inner layers are ends in a side of the inner layer 114 that is close to the outer layer 113 on which the memory devices $300_1$ and $300_2$ are mounted. The branch wires $722_3$ and $722_4$ are connected to intermediate portions between both ends of the inner layer wiring pattern 783.

The respective branch wires $721_1$ to $721_4$ have electrode pads $723_1$ to $723_4$ of first electrode pads, which are formed on the outer layer 113 on which the corresponding memory devices $300_1$ to $300_4$ are mounted, and to which the receiving terminals 301 of the memory devices $300_1$ to $300_4$ are joined.

The respective branch wires $721_1$ and $721_2$ have via conductors $725_1$ and $725_2$ between the outer layer and the inner layer, which are first via conductors that extend to the outer layer 113 from the via conductors 766 and 767 between the inner layers of the main wire 711. The respective branch wires $721_3$ and $721_4$ have via conductors $725_3$ and $725_4$ between the outer layer and the inner layer, which are first via conductors that extend to the outer layer 113 from the inner layer wiring pattern 763 of the main wire 711.

In addition, the respective branch wires $721_1$ to $721_4$ have leading wiring patterns $724_1$ to $724_4$ which are formed on the outer layer 113 and are first conductor patterns that electrically connect the electrode pads $723_1$ to $723_4$ with the via conductors $725_1$ to $725_4$ between the outer layer and the inner layer.

Incidentally, the via conductor 766 between the inner layers and the via conductor $725_1$ between the outer layer and the inner layer are integrally formed in the via 732. In addition, the via conductor 767 between the inner layers and the via conductor $725_2$ between the outer layer and the inner layer are integrally formed in the via 733.

The respective branch wires $722_1$ to $722_4$ have electrode pads $726_1$ to $726_4$ of second electrode pads, which are formed on the outer layer 113 on which the corresponding memory devices $300_1$ to $300_4$ are mounted, and to which the receiving terminals 302 of the memory devices $300_1$ to $300_4$ are joined.

In addition, the respective branch wires $722_1$ and $722_2$ have via conductors $728_1$ and $728_2$ between the outer layer and the inner layer, which are second via conductors that extend to the outer layer 113 from the via conductors 786 and 787 between the inner layers of the main wire 712. The respective branch wires $722_3$ and $722_4$ have via conductors $728_3$ and $728_4$ between the outer layer and the inner layer, which are second via conductors that extend to the outer layer 113 from the inner layer wiring pattern 783 of the main wire 712.

In addition, the respective branch wires $722_1$ to $722_4$ have leading wiring patterns $727_1$ to $727_4$ which are formed on the outer layer 113 and are second conductor patterns that electrically connect the electrode pads $726_1$ to $726_4$ with the via conductors $728_1$ to $728_4$ between the outer layer and the inner layer.

Incidentally, the via conductor 786 between the inner layers and the via conductor $728_1$ between the outer layer and the inner layer are integrally formed in the via 742. In addition, the via conductor 787 between the inner layers and the via conductor $728_2$ between the outer layer and the inner layer are integrally formed in the via 743.

According to the present third embodiment, a fly-by wiring structure can be provided that secures the operation stability in an inexpensive printed wiring board 700 which has large diameters of the vias 731 to 736 and 741 to 746.

The ringing which is observed in the memory devices $300_1$ to $300_4$ tends to increase more in a memory device closer to the memory controller 200. Because of this, in the present third embodiment, the wiring lengths of the branch wires $721_1$ and $722_1$ are shortened that are branched from the branch points P51 and P61 closest to the memory controller 200, specifically, closest to the starting ends 711a and 712a, which are specifically the wiring lengths of via conductors $725_1$ and $728_1$ between the outer layer and the inner layer. Furthermore, in the present third embodiment, the wiring lengths of the branch wires $721_2$ and $722_2$ are shortened which are branched from the branch points P52 and P62 that are secondly closest to the starting ends 711a and 712a, which are specifically the wiring lengths of via conductors $725_2$ and $728_2$ between the outer layer and the inner layer. Thereby, the ringing in the memory devices $300_1$ and $300_2$ can be effectively decreased. As a result, the printed circuit board can satisfy the input voltage conditions of the memory device $300_1$ of which the waveform tends to be most easily turbulent and the memory device $300_2$ of which the waveform tends to be next easily turbulent.

Fourth Embodiment

Figure 11A:
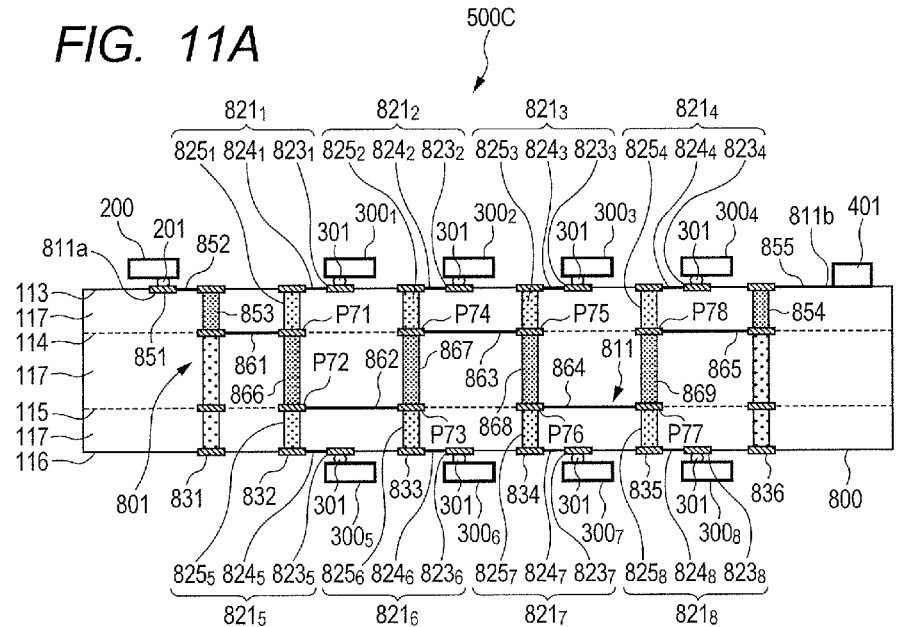
FIGS. 11A and 11B are sectional views of a printed circuit board according to a fourth embodiment.
Figure 11B:
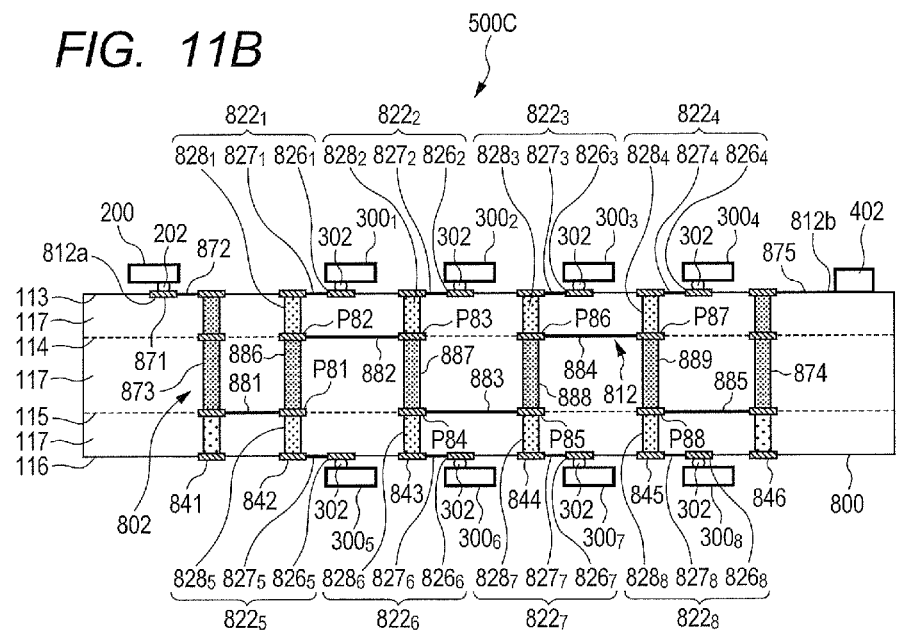

Next, a printed circuit board according to a fourth embodiment of the present invention will be described. FIGS. 11A and 11B are sectional views of the printed circuit board according to the fourth embodiment of the present invention. Incidentally, configurations similar to those in the above described first embodiment are designated by the same reference numerals, and the description will be omitted. In the above described first to the third embodiments, the case where the memory device is mounted on one outer layer of a printed wiring board has been described, but the present invention is not limited to the case. The memory device may be mounted on the other outer layer or on both outer layers, and in the present fourth embodiment, the case where the memory device is mounted on both outer layers will be described below.

A printed circuit board 500C of the present fourth embodiment has a printed wiring board 800, and a memory controller 200 as a transmitting element mounted on the printed wiring board 800. In addition, the printed circuit board 500C has a plurality (eight in the present fourth embodiment) of memory devices $300_1$ to $300_8$ as receiving elements.

The printed wiring board 800 has a plurality of address command wires which connect transmission terminals 201 and 202 of the memory controller 200 with the receiving terminals 301 and 302 of the respective memory devices $300_1$ to $300_8$ by a topology that is referred to as fly-by. The plurality of the address command wires is formed of an address command wire (first address command wire) 801 which belongs to a first group and an address command wire (second address command wire) 802 which belongs to a second group. FIG. 11A illustrates one address command wire 801; and FIG. 11B illustrates one address command wire 802.

The address command wire 801 includes a main wire (first main wire) 811 and a plurality (eight in the present fourth embodiment) of branch wires (first branch wires) $821_1$ to $821_8$, as is illustrated in FIG. 11A. The address command wire 802 includes a main wire (second main wire) 812 and a plurality (eight in the present fourth embodiment) of branch wires (second branch wires) $822_1$ to $822_8$, as is illustrated in FIG. 11B.

The main wire 811 is formed in series: and has a starting end 811a electrically connected to a transmission terminal (first transmission terminal) 201 of the memory controller 200 and a termination 811b electrically connected to one end of a termination resistor 401. Similarly, the main wire 812 is formed in series; and has a starting end 812a electrically connected to the transmission terminal (second transmission terminal) 202 of the memory controller 200 and the termination 812b electrically connected to one end of a termination resistor 402.

The respective branch wires $821_1$ to $821_8$ are branched from branch points P71 to P78 which are different from each other in the main wire 811, and are electrically connected to the receiving terminals (first receiving terminals) 301 of the corresponding memory devices out of eight memory devices $300_1$ to $300_8$, respectively. The respective branch wires $822_1$ to $822_8$ are branched from branch points P81 to P88 which are different from each other in the main wire 812, and are electrically connected to the receiving terminals (second receiving terminals) 302 of the corresponding memory devices out of eight memory devices $300_1$ to $300_8$, respectively. Specifically, one ends of the respective branch wires $821_1$ to $821_8$ are electrically connected to the respective branch points P71 to P78, and the other ends are electrically connected to the receiving terminals 301 of the respective memory devices $300_1$ to $300_8$. In addition, one ends of the respective branch wires $822_1$ to $822_8$ are electrically connected to the respective branch points P81 to P88, and the other ends are electrically connected to the receiving terminals 302 of the respective memory devices $300_1$ to $300_8$.

The memory controller 200, the respective memory devices $300_1$ to $300_4$ and the respective termination resistors 401 and 402 are mounted on the outer layer 113, and the respective memory devices $300_5$ to $300_8$ are mounted on the outer layer 116.

As is illustrated in FIG. 11A, the printed wiring board 800 has a plurality (six) of vias 831 to 836 for the address command wire 801 formed therein, which penetrate layers from the outer layer 113 to the outer layer 116, and have conductors provided in the inner perimeter surfaces thereof. In addition, as is illustrated in FIG. 11B, the printed wiring board 800 has a plurality (six) of vias 841 to 846 for the address command wire 802 formed therein, which penetrate layers from the outer layer 113 to the outer layer 116, and have conductors provided in the inner perimeter surfaces thereof.

The main wire 811 that is the first main wire has an electrode pad 851 which is formed on the outer layer 113 and is joined to the transmission terminal 201 of the memory controller 200, and an outer layer wiring pattern 852 which extends from the electrode pad 851. In addition, the main wire 811 has an outer layer wiring pattern 855 which extends from one end of the termination resistor 401. In addition, the main wire 811 has inner layer wiring patterns 861 to 865 that are a plurality (five in the present embodiment) of first inner layer wiring patterns which are wired on the inner layer 114 and the inner layer 115 so as to change layers between the inner layer 114 and the inner layer 115, from the starting end 811a toward the termination 811b. In addition, the main wire 811 has via conductors 866 to 869 between the inner layers, which connect five inner layer wiring patterns 861 to 865 in series, and are four first via conductors between the inner layers. In addition, the main wire 811 has a via conductor 853 between an outer layer and an inner layer, which connects the outer layer wiring pattern 852 with the inner layer wiring pattern 861, and has a via conductor 854 between the outer layer and the inner layer, which connects the inner layer wiring pattern 865 with the outer layer wiring pattern 855.

These via conductors 866 to 869 between the inner layers are conductors in portions between the inner layer 114 and the inner layer 115, in the vias 832 to 835. The via conductor 853 between the outer layer and the inner layer is a conductor in a portion between the outer layer 113 and the inner layer 114, in the via 831, and the via conductor 854 between the outer layer and the inner layer is a conductor in a portion between the outer layer 113 and the inner layer 114, in the via 836.

In addition, the main wire 812 that is the second main wire has an electrode pad 871 which is formed on the outer layer 113 and is joined to the transmission terminal 202 of the memory controller 200, and an outer layer wiring pattern 872 which extends from the electrode pad 871. In addition, the main wire 812 has an outer layer wiring pattern 875 which extends from one end of the termination resistor 402. In addition, the main wire 812 has inner layer wiring patterns 881 to 885 that are a plurality (five in the present embodiment) of second inner layer wiring patterns which are wired on the inner layer 114 and the inner layer 115 so as to change layers between the inner layer 114 and the inner layer 115, from the starting end 812a toward the termination 812b. In addition, the main wire 812 has via conductors 886 to 889 between the inner layers, which connect five inner layer wiring patterns 881 to 885 in series, and are four second via conductors between the inner layers. In addition, the main wire 812 has a via conductor 873 between an outer layer and an inner layer, which connects the outer layer wiring pattern 872 with the inner layer wiring pattern 881, and has a via conductor 874 between the outer layer and the inner layer, which connects the inner layer wiring pattern 885 with the outer layer wiring pattern 875.

These via conductors 886 to 889 between the inner layers are conductors in portions between the inner layer 114 and the inner layer 115, in the vias 842 to 845. The via conductor 873 between the outer layer and the inner layer is a conductor in a portion between the outer layer 113 and the inner layer 115, in the via 841, and the via conductor 874 between the outer layer and the inner layer is a conductor in a portion between the outer layer 113 and the inner layer 115, in the via 846.

The main wire 811 is wired so as to alternately change the layers, in such a way that the inner layer wiring pattern 861 is formed on the inner layer 114, the inner layer wiring pattern 862 is formed on the inner layer 115, the inner layer wiring pattern 863 is formed on the inner layer 114, the inner layer wiring pattern 864 is formed on the inner layer 115, and the inner layer wiring pattern 865 is formed on the inner layer 114. In addition, the main wire 812 is wired so as to alternately change the layers, in such a way that the inner layer wiring pattern 881 is formed on the inner layer 115, the inner layer wiring pattern 882 is formed on the inner layer 114, the inner layer wiring pattern 883 is formed on the inner layer 115, the inner layer wiring pattern 884 is formed on the inner layer 114, and the inner layer wiring pattern 885 is formed on the inner layer 115. Thus, the inner layer wiring patterns 881 to 885 of the main wire 812 are wired so as to alternately change the layer to the inner layer on the opposite side to that of the inner layer wiring patterns 861 to 865 of the main wire 811, from the starting end 812a toward the termination 812b.

At least the branch wire $821_1$ out of the plurality of the branch wires $821_1$ to $821_8$, which is branched from the branch point P71 that is closest to the starting end 811a of the main wire 811, is electrically connected to the via conductor between the inner layers of the main wire 811. In the present fourth embodiment, all the branch wires $821_1$ to $821_8$ are electrically connected to the via conductors 866 to 869 between the inner layers of the main wire 811, respectively. Specifically, one ends of the respective branch wires $821_1$ to $821_4$ are electrically connected to one ends of the respective via conductors 866 to 869 between the inner layers of the main wire 811, and one ends of the respective branch wires $821_5$ to $821_8$ are electrically connected to the other ends of the respective via conductors 866 to 869 between the inner layers of the main wire 811. One ends of the via conductors 866 to 869 between the inner layers are ends in a side of the inner layer 114 that is close to the outer layer 113 on which the memory devices $300_1$ to $300_4$ are mounted. The other ends of the via conductors 866 to 869 between the inner layers are ends in a side of the inner layer 115 that is close to the outer layer 116 on which the memory devices $300_5$ to $300_8$ are mounted.

Similarly, at least the branch wire $822_5$ out of the plurality of the branch wires $822_1$ to $822_8$, which is branched from the branch point P81 that is closest to the starting end 812a of the main wire 812, is electrically connected to the via conductor between the inner layers of the main wire 112. In the present fourth embodiment, all the branch wires $822_1$ to $822_8$ are electrically connected to the via conductors 886 to 889 between the inner layers of the main wire 812, respectively. Specifically, one ends of the respective branch wires $822_1$ to $822_4$ are electrically connected to one ends of the respective via conductors 886 to 889 between the inner layers of the main wire 812, and one ends of the respective branch wires $822_5$ to $822_8$ are electrically connected to the other ends of the respective via conductors 886 to 889 between the inner layers of the main wire 812. One ends of the via conductors 886 to 889 between the inner layers are ends in a side of the inner layer 114 that is close to the outer layer 113 on which the memory devices $300_1$ to $300_4$ are mounted. The other ends of the via conductors 886 to 889 between the inner layers are ends in a side of the inner layer 115 that is close to the outer layer 116 on which the memory devices $300_5$ to $300_8$ are mounted.

The respective branch wires $821_1$ to $821_4$ have electrode pads $823_1$ to $823_4$ of first electrode pads, which are formed on the outer layer 113 on which the corresponding memory devices $300_1$ to $300_4$ are mounted, and to which the receiving terminals 301 of the memory devices $300_1$ to $300_4$ are joined. The respective branch wires $821_5$ to $821_8$ have electrode pads $823_5$ to $823_8$ of first electrode pads, which are formed on the outer layer 116 on which the corresponding memory devices $300_5$ to $300_8$ are mounted, and to which the receiving terminals 301 of the memory devices $300_5$ to $300_8$ are joined.

In addition, the respective branch wires $821_1$ to $821_4$ have via conductors $825_1$ to $825_4$ between the outer layer and the inner layer, which are first via conductors that extend to the outer layer 113 from the via conductors 866 to 869 between the inner layers of the main wire 811. The respective branch wires $821_5$ to $821_8$ have via conductors $825_5$ to $825_8$ between the outer layer and the inner layer, which are first via conductors that extend to the outer layer 116 from the via conductors 866 to 869 between the inner layers of the main wire 811.

In addition, the respective branch wires $821_1$ to $821_4$ have leading wiring patterns $824_1$ to $824_4$ which are formed on the outer layer 113 and are first conductor patterns that electrically connect the electrode pads $823_1$ to $823_4$ with the via conductors $825_1$ to $825_4$ between the outer layer and the inner layer. The respective branch wires $821_5$ to $821_8$ have leading wiring patterns $824_5$ to $824_8$ which are formed on the outer layer 116 and are first conductor patterns that electrically connect the electrode pads $823_5$ to $823_8$ with the via conductors $825_5$ to $825_8$ between the outer layer and the inner layer.

Incidentally, the via conductor 866 between the inner layers and the via conductors $825_1$ and $825_5$ between the outer layer and the inner layer are integrally formed in the via 832. In addition, the via conductor 867 between the inner layers and the via conductors $825_2$ and $825_6$ between the outer layer and the inner layer are integrally formed in the via 833. In addition, the via conductor 868 between the inner layers and the via conductors $825_3$ and $825_7$ between the outer layer and the inner layer are integrally formed in the via 834. In addition, the via conductor 869 between the inner layers and the via conductors $825_4$ and $825_8$ between the outer layer and the inner layer are integrally formed in the via 835.

The respective branch wires $822_1$ to $822_4$ have electrode pads $826_1$ to $826_4$ of second electrode pads, which are formed on the outer layer 113 on which the corresponding memory devices $300_1$ to $300_4$ are mounted, and to which the receiving terminals 302 of the memory devices $300_1$ to $300_4$ are joined. The respective branch wires $822_5$ to $822_8$ have electrode pads $826_5$ to $826_8$ of second electrode pads, which are formed on the outer layer 116 on which the corresponding memory devices $300_5$ to $300_8$ are mounted, and to which the receiving terminals 302 of the memory devices $300_5$ to $300_8$ are joined.

In addition, the respective branch wires $822_1$ to $822_4$ have via conductors $828_1$ to $828_4$ between the outer layer and the inner layer, which are second via conductors that extend to the outer layer 113 from the via conductors 886 to 889 between the inner layers of the main wire 812. In addition, the respective branch wires $822_5$ to $822_8$ have via conductors $828_5$ to $828_8$ between the outer layer and the inner layer, which are second via conductors that extend to the outer layer 116 from the via conductors 886 to 889 between the inner layers of the main wire 812.

In addition, the respective branch wires $822_1$ to $822_4$ have leading wiring patterns $827_1$ to $827_4$ which are formed on the outer layer 113 and are second conductor patterns that electrically connect the electrode pads $826_1$ to $826_4$ with the via conductors $828_1$ to $828_4$ between the outer layer and the inner layer. The respective branch wires $822_5$ to $822_8$ have leading wiring patterns $827_5$ to $827_8$ which are formed on the outer layer 116 and are second conductor patterns that electrically connect the electrode pads $826_5$ to $826_8$ with the via conductors $828_5$ to $828_8$ between the outer layer and the inner layer.

Incidentally, the via conductor 886 between the inner layers and the via conductors $828_1$ and $828_5$ between the outer layer and the inner layer are integrally formed in the via 842. In addition, the via conductor 887 between the inner layers and the via conductors $828_2$ and $828_6$ between the outer layer and the inner layer are integrally formed in the via 843. In addition, the via conductor 888 between the inner layers and the via conductors $828_3$ and $828_7$ between the outer layer and the inner layer are integrally formed in the via 844. In addition, the via conductor 889 between the inner layers and the via conductors $828_4$ and $828_8$ between the outer layer and the inner layer are integrally formed in the via 845.

As has been described above, according to the present fourth embodiment, a fly-by wiring structure can be provided that secures the operation stability in an inexpensive printed wiring board 800 which has large diameters of the vias 831 to 836 and 841 to 846. In addition, the wiring lengths of the respective branch wires $821_1$ to $821_8$ and $822_1$ to $822_8$ become short, which are more specifically the wiring lengths of the respective via conductors $825_1$ to $825_8$ and $828_1$ to $828_8$ between the outer layer and the inner layer. Thereby, the print circuit board can reduce ringing in the respective memory devices $300_1$ to $300_8$, and can satisfy the input voltage conditions of the signal (signal of commanding address of DDR3 memory). The branch wires $821_1$ to $821_8$ and $822_1$ to $822_8$ are branched at the inner layer 114 or the inner layer 115, and accordingly the main wire does not need to be drawn out to an outer layer through the via and also to be drawn back to the inner layer through the via as in the conventional one. Accordingly, the number of the vias can be reduced, and an inexpensive printed wiring board 800 can be achieved.

In addition, because the memory devices $300_1$ to $300_8$ are mounted on both outer layers 113 and 116, and the branch wires are connected to both ends of the via conductors 866 to 869 and 886 to 889 between the inner layers, more memory devices can be mounted without upsizing the printed wiring board 800.

Incidentally, the present invention is not limited to the embodiments described above, and can be variously modified within a technological idea of the present invention by those who have an ordinary knowledge in the field.

In addition, in the above described first to fourth embodiments, the case where the memory controller is mounted on a printed wiring board has been described, but the present invention is not limited to the case. It is also acceptable that the memory controller is mounted on a mother board, the printed wiring board on which the memory device is mounted is configured to be detachable from the mother board, and the starting end of the main wire is electrically connected to the memory controller when the printed wiring board is mounted on the mother board.

ADVANTAGEOUS EFFECTS OF INVENTION

According to the present invention, a wiring length of the first and second branch wires becomes short which are branched at a branch point closest from starting ends in at least the first and second main wires, and thereby ringing in receiving elements can be reduced which are connected to at least these first and second branch wires. Because these first and second branch wires are branched at an inner layer, a main wire does not need to be drawn out to an outer layer through a via and also to be drawn back to the inner layer through the via as in the conventional one, which can reduce the number of vias and can achieve an inexpensive printed wiring board.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-254079, filed Nov. 20, 2012 which is hereby incorporated by reference herein in its entirety.

The invention claimed is:

1. A printed wiring board comprising:
a first outer layer;
a second outer layer on the opposite side of the first outer layer;
a first inner layer arranged between the first outer layer and the second outer layer;
a second inner layer that is arranged between the first outer layer and the second outer layer and is positioned closer to the second outer layer than the first inner layer, wherein
the first outer layer, the second outer layer, the first inner layer and the second inner layer are laminated with insulating layers disposed therebetween;
a first main wire, wherein
the first main wire has a plurality of first inner layer wiring patterns which are provided so as to have an electrode pad formed on the first outer layer for mounting a transmitting element thereon as a starting end, and alternate between the first inner layer and the second inner layer, toward a termination, and has a plurality of first via conductors between the inner layers, which connect the first inner layer wiring patterns provided on different layers to each other;
a plurality of first branch wires that are sequentially branched from the starting end toward the termination of the first main wire, wherein
the respective first branch wires comprise leading wires that are formed on the first outer layer, and first via conductors between the outer layer and the inner layer, and connect electrode pads formed on the first outer layer for mounting receiving elements thereon, with the first inner layer wiring patterns formed on the first inner layer;
a second main wire, wherein
the second main wire has a plurality of second inner layer wiring patterns which are provided so as to have an electrode pad formed on the first outer layer for mounting the transmitting element thereon as a starting end, and alternate between the first inner layer and the second inner layer, toward a termination, and has a plurality of second via conductors between the inner layers, which connect the second inner layer wiring patterns provided on the different layers to each other; and a plurality of second branch wires which are sequentially branched from the starting end toward the termination of the second main wire, wherein the respective second branch wires comprise leading wires that are formed on the first outer layer, and second via conductors between the outer layer and the inner layer, and connect electrode pads formed on the first outer layer for mounting the receiving element thereon, with the second inner layer wiring patterns formed on the first inner layer, wherein the plurality of second inner layer wiring patterns are wired so as to alternately change the layer to the inner layer on the opposite side to that of the plurality of first inner layer wiring patterns, from the starting end toward the termination.

2. The printed wiring board according to claim 1, wherein the first inner layer wiring patterns and the second inner layer wiring patterns are provided at positions where at least part of the respective wiring patterns overlaps each other, when viewed as a plane from a direction of the first outer layer of the printed wiring board.

3. The printed wiring board according to claim 1, wherein the first via conductors between the inner layers and the first via conductors between the outer layer and the inner layer are formed of the same via conductor, and the second via conductors between the inner layers and the second via conductors between the outer layer and the inner layer are formed of the same via conductor.

4. The printed wiring board according to claim 1, wherein wiring lengths of the first branch wires and the second branch wires are each 5 mm or less.

5. An electronic device, comprising:
the printed wiring board according to claim 1.

6. A printed wiring board comprising:
a first outer layer;
a second outer layer on the opposite side of the first outer layer;
a first inner layer arranged between the first outer layer and the second outer layer;
a second inner layer that is arranged between the first outer layer and the second outer layer and is positioned closer to the second outer layer than the first inner layer, wherein
the first outer layer, the second outer layer, the first inner layer and the second inner layer are laminated with insulating layers disposed therebetween;
a first main wire, wherein
the first main wire has a plurality of first inner layer wiring patterns which are provided so as to have an electrode pad formed on the first outer layer for mounting a transmitting element thereon as a starting end, and alternate between the first inner layer and the second inner layer, toward a termination, and has a plurality of first via conductors between the inner layers, which connect the first inner layer wiring patterns provided on different layers to each other;
a plurality of first branch wires that are sequentially branched from the starting end toward the termination of the first main wire, wherein
out of the plurality of the first branch wires, a first branch wire which is the closest to the starting end of the first main wire comprises a leading wire that is formed on the first outer layer and a first via conductor between the outer layer and the inner layer, and connects an electrode pad formed on the first outer layer for mounting receiving elements thereon, with the first inner layer wiring patterns formed on the first inner layer;
a second main wire, wherein
the second main wire has a plurality of second inner layer wiring patterns which are provided so as to have an electrode pad formed on the first outer layer for mounting the transmitting element thereon as a starting end, and alternate between the first inner layer and the second inner layer, toward a termination, and has a plurality of second via conductors between the inner layers, which connect the second inner layer wiring patterns provided on the different layers to each other; and a plurality of second branch wires which are sequentially branched from the starting end toward the termination of the second main wire, wherein out of the plurality of the second branch wires, a second branch wire which is the closest to the starting end of the second main wire comprises a leading wire that is formed on the first outer layer and a second via conductor between the outer layer and the inner layer, and connects an electrode pad formed on the first outer layer for mounting the receiving elements thereon, with the second inner layer wiring patterns formed on the first inner layer, wherein the plurality of second inner layer wiring patterns are wired so as to alternately change the layer to the inner layer on the opposite side to that of the plurality of first inner layer wiring patterns, from the starting end toward the termination.

7. The printed wiring board according to claim 6, wherein the first inner layer wiring patterns and the second inner layer wiring patterns are provided at positions where at least part of the respective wiring patterns overlaps each other, when viewed as a plane from a direction of the first outer layer of the printed wiring board.

8. The printed wiring board according to claim 6, wherein the first via conductors between the inner layers and the first via conductor between the outer layer and the inner layer are formed of the same via conductor, and the second via conductors between the inner layers and the second via conductor between the outer layer and the inner layer are formed of the same via conductor.

9. The printed wiring board according to claim 6, wherein wiring lengths of the first branch wires and the second branch wires are each 5 mm or less.

10. A printed wiring board comprising:
a first outer layer;
a second outer layer on the opposite side of the first outer layer;
a first inner layer arranged between the first outer layer and the second outer layer;
a second inner layer that is arranged between the first outer layer and the second outer layer and is positioned closer to the second outer layer than the first inner layer, wherein
the first outer layer, the second outer layer, the first inner layer and the second inner layer are laminated with insulating layers disposed therebetween;
a first main wire, wherein
the first main wire has a plurality of first inner layer wiring patterns which are provided so as to have an electrode pad formed on the first outer layer for mounting a transmitting element thereon as a starting end, and alternate between the first inner layer and the second inner layer, toward a termination, and has a plurality of first via conductors between the inner layers, which connect the first inner layer wiring patterns provided on different layers to each other;

a plurality of first branch wires that are sequentially branched from the starting end toward the termination of the first main wire, wherein the first branch wires comprise:

branch wires which respectively comprise leading wires that are formed on the first outer layer and first via conductors between the outer layer and the inner layer, and which connect electrode pads formed on the first outer layer for mounting receiving elements thereon, with the first inner layer wiring patterns formed on the first inner layer; and branch wires which respectively comprise leading wires that are formed on the second outer layer and third via conductors between the outer layer and the inner layer, and which connect electrode pads formed on the second outer layer for mounting the receiving elements thereon, with the first inner layer wiring patterns formed on the second inner layer;

a second main wire, wherein the second main wire has a plurality of second inner layer wiring patterns which are provided so as to have an electrode pad formed on the first outer layer for mounting the transmitting element thereon as a starting end, and alternate between the first inner layer and the second inner layer, toward a termination, and has a plurality of second via conductors between the inner layers, which connect the second inner layer wiring patterns provided on different layers to each other; and a plurality of second branch wires which are sequentially branched from the starting end toward the termination of the second main wire, wherein the second branch wires comprise:

branch wires which respectively comprise leading wires that are formed on the first outer layer and second via conductors between the outer layer and the inner layer, and which connect electrode pads formed on the first outer layer for mounting the receiving elements thereon, with the second inner layer wiring patterns formed on the first inner layer; and branch wires which respectively comprise leading wires that are formed on the second outer layer and fourth via conductors between the outer layer and the inner layer, and which connect electrode pads formed on the second outer layer for mounting the receiving elements thereon, with the second inner layer wiring patterns formed on the second inner layer, wherein the plurality of second inner layer wiring patterns are wired so as to alternately change the layer to the inner layer on the opposite side to that of the plurality of first inner layer wiring patterns, from the starting end toward the termination.

11. The printed wiring board according to claim 10, wherein the first inner layer wiring patterns and the second inner layer wiring patterns are provided at positions where at least part of the respective wiring patterns overlaps each other, when viewed as a plane from a direction of the first outer layer of the printed wiring board.

12. The printed wiring board according to claim 10, wherein the first via conductors between the inner layers and the first via conductors between the outer layer and the inner layer are formed of the same via conductor, and the second via conductors between the inner layers and the second via conductors between the outer layer and the inner layer are formed of the same via conductor.

13. The printed wiring board according to claim 10, wherein wiring lengths of the first branch wires and the second branch wires are each 5 mm or less.

14. A printed circuit board comprising:

a transmitting element;

a plurality of receiving elements; and a printed wiring board on which the transmitting element and the plurality of the receiving elements are mounted, wherein the printed wiring board comprises:

a first outer layer;

a second outer layer on the opposite side of the first outer layer;

a first inner layer arranged between the first outer layer and the second outer layer;

a second inner layer that is arranged between the first outer layer and the second outer layer and is positioned closer to the second outer layer than the first inner layer, wherein the first outer layer, the second outer layer, the first inner layer and the second inner layer are laminated with insulating layers disposed therebetween;

a first main wire, wherein the first main wire has a plurality of first inner layer wiring patterns which are provided so as to have an electrode pad, on which the transmitting element is mounted, formed on the first outer layer, as a starting end, and alternate between the first inner layer and the second inner layer, toward a termination, and has a plurality of first via conductors between the inner layers, which connect the first inner layer wiring patterns provided on different layers to each other;

a plurality of first branch wires that are sequentially branched from the starting end toward the termination of the first main wire, wherein the respective first branch wires comprise leading wires that are formed on the first outer layer, and first via conductors between the outer layer and the inner layer, and connect electrode pads, on which the receiving elements are mounted, formed on the first outer layer, with the first inner layer wiring patterns formed on the first inner layer;

a second main wire, wherein the second main wire has a plurality of second inner layer wiring patterns which are provided so as to have an electrode pad, on which the transmitting element is mounted, formed on the first outer layer, as a starting end, and alternate between the first inner layer and the second inner layer, toward a termination, and has a plurality of second via conductors between the inner layers, which connect the second inner layer wiring patterns provided on the different layers to each other; and a plurality of second branch wires which are sequentially branched from the starting end toward the termination of the second main wire, wherein the respective second branch wires comprise leading wires that are formed on the first outer layer, and second via conductors between the outer layer and the inner layer, and connect electrode pads, on which the receiving elements are mounted, formed on the first outer layer, with the second inner layer wiring patterns formed on the first inner layer, wherein the plurality of second inner layer wiring patterns are wired so as to alternately change the layer to the inner layer on the opposite side to that of the plurality of first inner layer wiring patterns, from the starting end toward the termination.

15. The printed circuit board according to claim 14, wherein a termination resistor is mounted on each of the terminations of the first main wire and the second main wire.

16. The printed circuit board according to claim 14, wherein the first inner layer wiring patterns and the second inner layer wiring patterns are provided at positions where at least part of the respective wiring patterns overlaps each other, when viewed as a plane from a direction of the first outer layer of the printed wiring board.

17. The printed circuit board according to claim 14, wherein the first via conductors between the inner layers and the first via conductors between the outer layer and the inner layer are formed of the same via conductor, and the second via conductors between the inner layers and the second via conductors between the outer layer and the inner layer are formed of the same via conductor.

18. The printed circuit board according to claim 14, wherein wiring lengths of the first branch wires and the second branch wires are each 5 mm or less.

19. An electronic device, comprising:
the printed circuit board according to claim 14.

* * * * *